(12) United States Patent
Ueyanagi

(10) Patent No.: US 7,492,673 B2
(45) Date of Patent: *Feb. 17, 2009

(54) OPTICALLY ASSISTED MAGNETIC RECORDING DEVICE WITH SEMICONDUCTOR LASER, OPTICALLY ASSISTED MAGNETIC RECORDING HEAD AND MAGNETIC DISK DEVICE

(75) Inventor: Kiichi Ueyanagi, Nakai-machi (JP)

(73) Assignee: Fuji Xerox Co., Ltd., Tokyo (JP)

( * ) Notice: Subject to any disclaimer, the term of this patent is extended or adjusted under 35 U.S.C. 154(b) by 493 days.

This patent is subject to a terminal disclaimer.

(21) Appl. No.: 11/038,539

(22) Filed: Jan. 21, 2005

(65) Prior Publication Data

US 2005/0122849 A1  Jun. 9, 2005

Related U.S. Application Data

(62) Division of application No. 09/777,674, filed on Feb. 7, 2001, now Pat. No. 6,876,604.

(30) Foreign Application Priority Data

| Mar. 10, 2000 | (JP) | ............................ 2000-066854 |
| Sep. 5, 2000 | (JP) | ............................ 2000-268296 |

(51) Int. Cl.
*G11B 11/00* (2006.01)
(52) U.S. Cl. .................................. 369/13.32; 369/13.17
(58) Field of Classification Search .............. 369/13.17, 369/13.23, 13.32; G11B 11/00
See application file for complete search history.

(56) References Cited

U.S. PATENT DOCUMENTS

| 4,832,456 | A | | 5/1989 | Yamazaki et al. |
| 5,065,390 | A | | 11/1991 | Miyauchi et al. |
| 5,199,090 | A | | 3/1993 | Bell |
| 5,244,751 | A | * | 9/1993 | Takayama et al. ......... 428/836.2 |
| 5,349,592 | A | * | 9/1994 | Ando .......................... 372/32 |
| 5,353,268 | A | * | 10/1994 | Hintz ....................... 369/13.35 |
| 5,402,293 | A | * | 3/1995 | Smith ........................ 369/13.1 |

(Continued)

FOREIGN PATENT DOCUMENTS

EP  0915458 A2 *  5/1999

(Continued)

OTHER PUBLICATIONS

R. L. White, "Progress and Prospects In Magnetic Data Storage", Tech. Digest of Moris, 1999, 11-A-03, pp. 6-7.

(Continued)

*Primary Examiner*—Aristotelis M Psitos
(74) *Attorney, Agent, or Firm*—Oliff & Berridge, PLC

(57) ABSTRACT

The present invention provides a magnetooptic device, a magnetooptic head, and a magnetic disk drive each capable of performing optically assisted magnetic recording and each having a small size, improved recording density, and a higher transfer rate. In a magnetooptic device, a magnetic circuit including a magnetic gap and a thin film magnetic transducer having a coil portion are stacked on the surface of a semiconductor laser. By the arrangement, optically assisted magnetic recording can be performed, small size and light weight are achieved, and higher transfer rate can be implemented.

20 Claims, 19 Drawing Sheets

U.S. PATENT DOCUMENTS

| | | |
|---|---|---|
| 5,444,730 A | 8/1995 | Mizutani |
| 5,497,359 A * | 3/1996 | Mamin et al. ............ 369/44.15 |
| 5,615,183 A * | 3/1997 | Ishii ........................ 369/13.23 |
| 5,642,336 A | 6/1997 | Albertini et al. |
| 5,793,407 A * | 8/1998 | Park et al. .................... 347/258 |
| 5,886,959 A * | 3/1999 | Bischoff et al. .......... 369/13.23 |
| 5,986,978 A | 11/1999 | Rottmayer et al. |
| 6,016,290 A | 1/2000 | Chen et al. |
| 6,044,041 A * | 3/2000 | Ishizaki et al. ........... 369/13.32 |
| 6,130,863 A | 10/2000 | Wang et al. |
| 6,154,326 A * | 11/2000 | Ueyanagi et al. ............ 359/819 |
| 6,272,097 B1 | 8/2001 | Nakao et al. |
| 6,275,453 B1 * | 8/2001 | Ueyanagi et al. ......... 369/44.14 |
| 6,317,280 B1 | 11/2001 | Nakajima et al. |
| 6,320,708 B1 * | 11/2001 | Ueyanagi et al. ............ 359/824 |
| 6,396,776 B1 * | 5/2002 | Ueyanagi .................. 369/13.33 |
| 6,455,174 B1 | 9/2002 | Takao et al. |
| 6,706,358 B1 | 3/2004 | McDaniel et al. |
| 6,771,589 B2 * | 8/2004 | Ueyanagi et al. ............. 369/300 |
| 6,775,100 B1 | 8/2004 | Belser et al. |
| 6,876,604 B2 * | 4/2005 | Ueyanagi .................. 369/13.23 |

FOREIGN PATENT DOCUMENTS

| | | |
|---|---|---|
| EP | 0944049 A2 * | 9/1999 |
| JP | A-11-096608 | 4/1999 |
| JP | 2000-331302 A * | 11/2000 |

OTHER PUBLICATIONS

Nikkei Electronics, No. 734, Jan. 11, 1999, pp. 35-42.

* cited by examiner

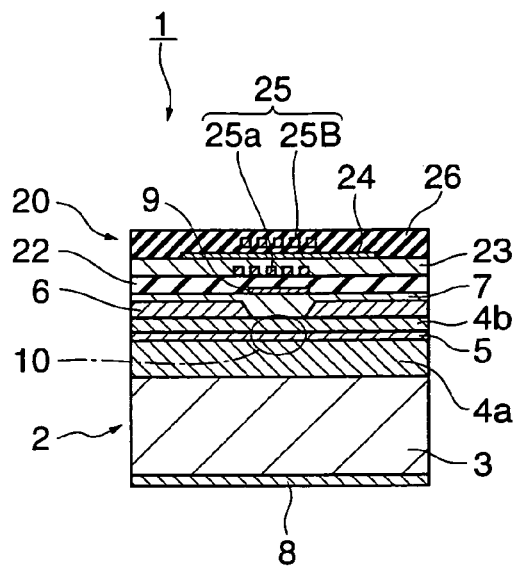
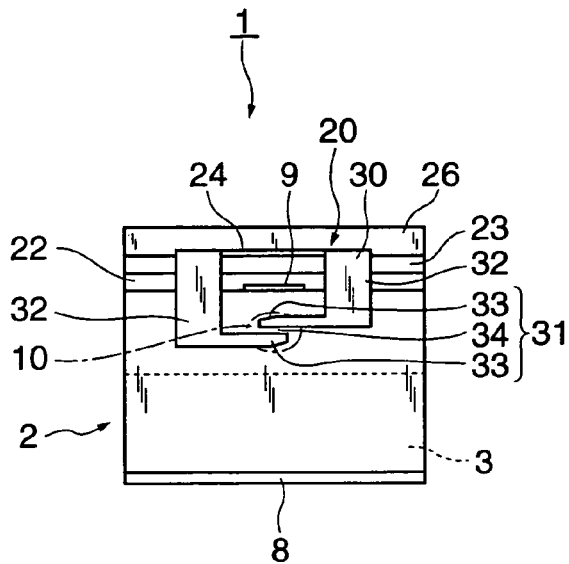
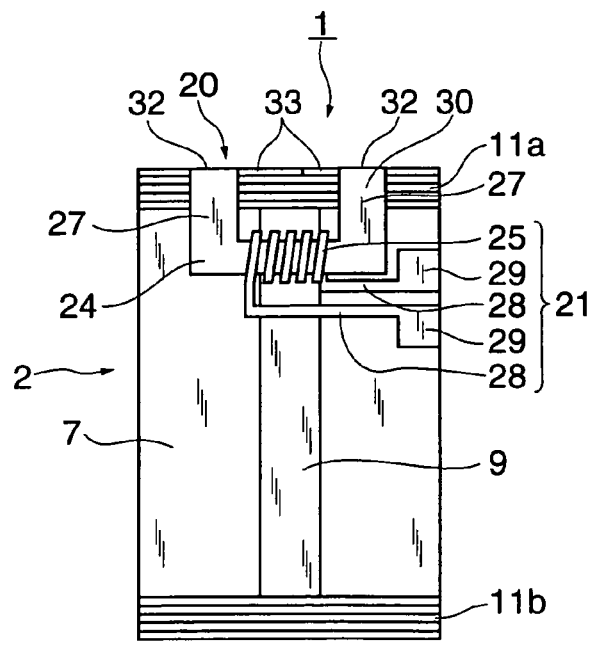

OPTICALLY ASSISTED MAGNETIC RECORDING DEVICE WITH SEMICONDUCTOR LASER, OPTICALLY ASSISTED MAGNETIC RECORDING HEAD AND MAGNETIC DISK DEVICE

This is a Division of application Ser. No. 09/777,674 filed Feb. 7, 2001. The entire disclosure of the prior application is hereby incorporated by reference herein.

BACKGROUND OF THE INVENTION

1. Field of the Invention

The present invention relates to a magnetooptic device, a magnetooptic head, and a magnetic disk drive each performing optically assisted magnetic (OAM) recording in which information is recorded onto a magnetic recording film or a magnetooptic recording film by using a beam spot and a magnetic field and information is reproduced by using a magnetic gap or a magnetic sensor.

2. Description of the Prior Art

In a hard disk drive for recording and reproducing information by using a magnetic recording film, a magnetoresistive (MR) sensor using a magnetoresistive effect and a high-sensitive high-resolution GMR (giant-magnetoresistive) sensor (hereinbelow, the sensors will be collectively called MR sensors) have been developed for reproduction, and the recording density has been increased at an annual rate of 60 percent in the past several years. It has been however found recently that the limit of surface density is about 30 Gbits/inch$^2$ due to the super paramagnetic effect, that is, an effect that the direction of the magnetization in a certain magnetic domain is reversed by the adjacent magnetization in the opposite direction due to thermal fluctuation (R. L. White, Tech. Digest of MORIS, '99, 11-A-03, (1999), p. 7).

As a promising method for solving the problem, OAM (Optically Assisted Magnetic) recording has been proposed. According to the method, a magnetization film is heated by irradiation of a laser beam to lower the intensity of magnetization of the film and, in such a state, information is recorded. By this method, information can be recorded onto a magnetic film having a high coercive force and the reversal of magnetization at the room temperature is prevented.

An example of such a conventional magnetooptic head is described in Nikkei Electronics No. 734, Jan. 11, 1999, p. 35.

FIG. 20 shows the magnetooptic head. In the magnetooptic head 100, a beam spot 107 is formed on a light-receiving surface 106b of an SIL 106 by a condensing lens 105, and a coil 110 is provided around the light-receiving surface 106b. While modulating a magnetic field by the coil 110 0 on the basis of an information signal for recording, a magnetooptic recording film 51a on an optical disk 51 is intermittently irradiated with a near field wave 107a leaked from the light-receiving surface 106b to thereby record information (this will be called laser-pumped modified field magnetic (LP-MFM) recording, thereby enabling a recording mark having a length shorter than the diameter of the beam spot to be formed). Information is reproduced by using a magnetic sensor 111 using a magnetoresistive thin film as a sensing portion. According to the method, the size of the condensed beam spot 107 can be reduced in inverse proportion to the refractive index of the SIL 106, so that a small recording magnetic domain having a width of about 0.3 μm can be formed and high recording density can be implemented.

According to the conventional magnetooptic head, however, the coil for generating the modulated magnetic field and the magnetic sensor for reading magnetic information are provided separate from the semiconductor laser and the optical system. Due to the arrangement, the magnetooptic head has problems such that its size is large and the transfer rate cannot be increased due to the limitation in reducing the weight.

SUMMARY OF THE INVENTION

The present invention therefore provides a magnetooptic device, a magnetooptic head and a magnetic disk drive each having a small size and a high transfer rate and each capable of performing the optically assisted magnetic recording.

The invention also provides a magnetooptic device, a magnetooptic head and a magnetic disk drive each having improved recording density.

According to an aspect of the present invention, a magnetooptic device has: a semiconductor laser which emits a laser beam from a laser beam output surface; and a thin film magnetic transducer stacked on the semiconductor laser.

By stacking the thin film magnetic transducer on the semiconductor laser, the magnetooptic device becomes smaller and lighter as compared with a magnetic device in which the thin film magnetic transducer and the semiconductor laser are provided separately. The optically assisted magnetic recording can be performed in a small region in a magnetic recording medium, which is determined by the size of the magnetic gap in the thin film magnetic transducer.

According to another aspect of the invention, a magnetooptic device has: a semiconductor laser which emits a laser beam from a laser beam output surface; a shading body having an opening in a laser beam output position in the laser beam output surface; and a thin film magnetic transducer which has a magnetic gap in the laser beam output surface and is stacked on the semiconductor laser.

With the configuration, by the reduced sizes of the opening and the magnetic gap, the recording density is improved.

According to still another aspect of the invention, a magnetooptic device has: a semiconductor laser which emits a laser beam from a laser beam output surface; and a thin film magnetic transducer and a magnetoresistive sensor which are stacked on the semiconductor laser.

With the configuration, the magnetoresistive sensor and the thin film magnetic transducer can be formed continuously with the semiconductor laser by using the conventional, established process of fabricating the magnetoresistive sensor and the thin film magnetic transducer. The magnetooptic device becomes smaller and lighter as compared with a magnetic device in which the thin film magnetic transducer and the magnetoresistive sensor are provided separate from the semiconductor laser. The optically assisted magnetic recording can be performed in a small region in a magnetic recording medium, which is determined by the size of the magnetic gap in the thin film magnetic transducer, and information can be reproduced by a magnetic sensor.

The magnetoresistive sensor may be stacked after the thin film magnetic transducer is stacked on the semiconductor laser. Since the magnetoresistive sensor is formed apart from the semiconductor laser with this configuration, the sensitivity and the life of the magnetoresistive sensor can be prevented from deterioration when the semiconductor laser is heated.

According to still another aspect of the invention, a magnetooptic head has: a magnetooptic device having a semiconductor laser which emits a laser beam from a laser beam output surface and a thin film magnetic transducer which has a magnetic gap in the laser beam output surface and is stacked on the semiconductor laser; and a flying slider which holds the magnetooptic device and flies in a predetermined direction relative to a recording medium over the recording medium.

With the configuration, the magnetooptic head can be made smaller and lighter as compared with a magnetooptic head in which the thin film magnetic transducer and the semiconductor laser are provided separately.

According to still another aspect of the invention, a magnetooptic head has: a magnetooptic device having a semiconductor laser which emits a laser beam from a laser beam output surface and a shading body having an opening in a laser beam output position in the laser beam output surface, and a thin film magnetic transducer which has a magnetic gap in the laser beam output surface and is stacked on the semiconductor laser; and a flying slider which holds the magnetooptic device and flies in a predetermined direction relative to a recording medium over the recording medium.

With the configuration, by reducing sizes of the opening and the magnetic gap, the recording density is improved.

According to still another aspect of the invention, a magnetooptic head has: a semiconductor laser which emits a laser beam; a transparent condensing medium having an incident surface on which the laser beam from the semiconductor laser is incident and a light-receiving surface on which the laser beam incident on the incident surface is condensed to thereby form a beam spot; and a thin film magnetic transducer including a magnetic circuit which is stacked on the light-receiving surface and has a magnetic gap, and a coil wound around a core as a component of the magnetic circuit.

With the configuration, by stacking the thin film magnetic transducer including the magnetic circuit having the magnetic gap and the coil on the light-receiving surface of the transparent condensing medium, the magnetooptic head becomes smaller and lighter as compared with a magnetooptic head in which the thin film magnetic transducer is provided separately.

According to further another aspect of the invention, a magnetooptic head has: a semiconductor laser which emits a laser beam; a transparent condensing medium having an incident surface on which the laser beam from the semiconductor laser is incident and a light-receiving surface on which the laser beam incident on the incident surface is condensed to thereby form a beam spot; a shading body having an opening smaller than the beam spot in a position in which the beam spot is formed in the light-receiving surface; and a thin film magnetic transducer which is stacked on the light-receiving surface and has a magnetic gap.

With the configuration, by the reduced sizes of the opening and the magnetic gap, the recording density is improved.

According to further another aspect of the invention, a magnetooptic head has: a magnetooptic device having a semiconductor laser which emits a laser beam from a laser beam output surface, and a thin film magnetic transducer and a magnetoresistive sensor which are stacked on the semiconductor laser; and a flying slider which holds the magnetooptic device and flies over a recording medium.

With the configuration, the magnetoresistive sensor and the thin film magnetic transducer can be formed continuously with the semiconductor laser by using the conventional, established process of fabricating the magnetoresistive sensor and the thin film magnetic transducer. The magnetooptic head becomes smaller and lighter as compared with a magnetic head in which the thin film magnetic transducer and the magnetoresistive sensor are provided separately from the semiconductor laser. The optically assisted magnetic recording can be performed in a small region in a magnetic recording medium, which is determined by the size of the magnetic gap in the thin film magnetic transducer, and information can be reproduced by a magnetic sensor.

According to still another aspect of the invention, a magnetooptic head has: a magnetooptic device including a semiconductor laser which emits a laser beam from a laser beam output surface, a shading body having an opening in a laser beam output position in the laser beam output surface, a thin film magnetic transducer which is stacked on the semiconductor laser and has a magnetic gap in the laser beam output surface, and a magnetoresistive sensor; and a flying slider which holds the magnetooptic device and flies over a recording medium in a predetermined direction relative to the recording medium.

With the configuration, the magnetoresistive sensor and the thin film magnetic transducer can be formed continuously with the semiconductor laser by using the conventional, established process of fabricating the magnetoresistive sensor and the thin film magnetic transducer. The magnetooptic head becomes smaller and lighter as compared with a magnetic head in which the thin film magnetic transducer and the magnetoresistive sensor are provided separately from the semiconductor laser. By the reduced sizes of the opening and the magnetic gap, the recording density is improved.

According to further another aspect of the invention, a magnetic disk drive has: a magnetooptic device having a semiconductor laser which emits a laser beam from a laser beam output surface and a thin film magnetic transducer which has a magnetic gap in the laser beam output surface and is stacked on the semiconductor laser; a disk on which a recording medium is formed on the surface; a flying slider which holds the magnetooptic device and flies over the recording medium; and a moving unit which moves the flying slider relative to the disk.

With the configuration, by stacking the thin film magnetic transducer on the semiconductor laser, the magnetooptic device and, moreover, the magnetic disk drive become smaller and lighter as compared with those in which the thin film magnetic transducer is provided separately from the semiconductor laser.

According to still another aspect of the invention, a magnetic disk drive has: a magnetooptic device having a semiconductor laser which emits a laser beam, a transparent condensing medium including an incident surface on which the laser beam from the semiconductor laser is incident and a light-receiving surface on which the laser beam incident on the incident surface is condensed so as to form a beam spot, and a thin film magnetic transducer which is stacked on the light-receiving surface and has a magnetic gap; a disk on which a recording medium is formed on the surface; a flying slider which holds the magnetooptic device and flies over the recording medium; and a moving unit which moves the flying slider relative to the disk.

With the configuration, by stacking the thin film magnetic transducer including the magnetic circuit having the magnetic gap and the coil on the light-receiving surface of the transparent condensing medium, the magnetooptic device and, moreover, the magnetic disk drive become smaller and lighter as compared with those in which the thin film magnetic transducer is provided separately.

BRIEF DESCRIPTION OF THE DRAWINGS

Preferred embodiments of the present invention will be described in detail based on the followings, wherein:

FIGS. 1A, 1B and 1C are, respectively, a section view of a main portion, an end view on a laser beam output surface side, and a top view of a magnetooptic device according to a first embodiment of the invention;

DETAILED DESCRIPTION OF THE PREFERRED EMBODIMENTS

Figure 2A:
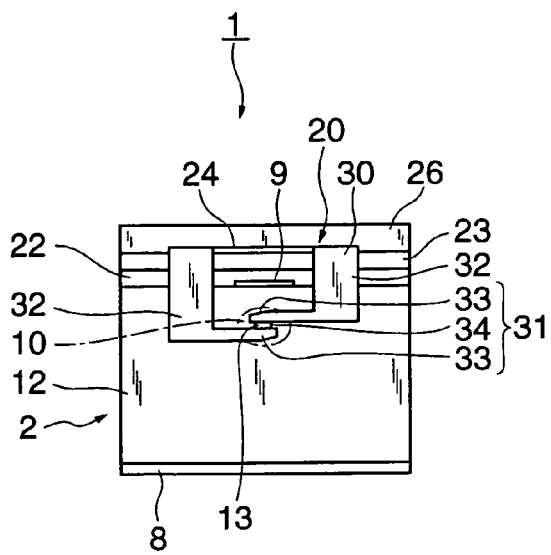
FIGS. 2A and 2B are, respectively, an end view on a laser beam output surface side and a top view of a magnetooptic device according to a second embodiment of the invention.

FIG. 1A is a section view showing a main portion of a magnetooptic device according to a first embodiment of the invention. FIG. 1B is an end view on the side of a laser beam output surface. FIG. 1C is a top view of the magnetooptic device. The magnetooptic device 1 has a semiconductor laser 2 and a thin film magnetic transducer 20 stacked on the surface of the semiconductor laser 2.

As the semiconductor laser 2, a laser of any type such as a buried ridge type, a gain guide type, a buried heterostructure type, or a type in which an oscillation region is limited by implanting protons can be used. In the embodiment, a regular buried ridge laser is used, which mainly has an n-type cladding layer 4a, an active layer 5, a p-type cladding layer 4b, a current limiting layer 6, a p-type cap layer 7, an n-type electrode (cathode) 8, and a p-type electrode (anode) 9 which are sequentially formed on a substrate 3. As the laser 2, for example, an AlGaInP laser for generating a laser beam of red (650 nm) can be used. The invention is not limited to the laser but a laser of infrared or blue can also be employed. Although the laser of a single basic mode oscillation is used in the embodiment, a multi-mode laser may also be used. A laser of a type in which an oscillation region is narrow or a laser of a type in which the oscillation region is limited by using a material having a refractive index largely different from that of the active layer 5 may also be used. By using the laser of a type in which the oscillation region is narrow or the laser of a type in which the oscillation region is limited, the volume of the oscillation region can be decreased, so that high efficiency can be achieved.

The thin film magnetic transducer 20 has: a magnetic circuit 30 including a core 24, a yoke 27, and a pole portion 32 which are made of a soft magnetic material such as Permalloy, and having a magnetic gap 34 in the laser beam output surface of the semiconductor laser 2; and a coil portion 21 which is made by a Cu thin film disposed on the top face of the semiconductor laser 2 and which has a coil 25 (25a and 25b) wound around the core 24 in the magnetic circuit 30, a pair of lead wires 28 extending from the coils 25a and 25b, respectively, and pads 29 provided at ends of the pair of lead wires 28. A gap portion 31 is constructed by the magnetic gap 34 and a pair of pole tips 33.

An example of a method of fabricating the magnetooptic device 1 will now be described. After forming the semiconductor laser 2, the p-type electrode 9 is buried flatly using an insulating film 22 made of SiO$_2$ or the like and the thin film magnetic transducer 20 is formed. More specifically, by a regular thin film process, the bottom coil 25a made by a Cu thin film is formed by sputtering and lithography and is buried and planarized with the insulating film 23. The core 24, the top coil 25b made by the Cu thin film and the yoke 27 are embedded in the insulating film 26. In such a manner, the coil portion 21 is completed. After cleavage, a high reflection film 11b made by a dielectric multilayer is deposited on the rear end face side and a partly transmitting film 11a also made by a dielectric multilayer is deposited on the laser beam output surface side, thereby completing the laser. The pole portion 32 and the magnetic gap 34 are formed by sputtering and lithography in the laser beam output surface, thereby completing the magnetooptic device 1 of the embodiment. The pole portion 32 is embedded in the partly transmitting film 11a so that their surfaces are flush with each other.

The operation of the first embodiment will now be described. At the time of recording, since a laser beam 10 and a magnetic field can be applied to the same position in a magnetic recording medium (not shown), what is called optically assisted magnetic recording is performed as follows. A recording portion in the magnetic recording medium is heated by irradiation of the laser beam to decrease the coercive force of the portion, and information is recorded by a modulated magnetic field. The size of the laser beam 10 is not particularly limited and remains as an optimum size determined by the oscillation region in the active layer 5. Consequently, a maximum output is obtained. The size is about 2 to 3 µm in the parallel direction of the active layer 5 and is about 1 µm in the vertical direction of the active layer 5. By the irradiation of the laser beam 10, the recording area of almost the same size as that of the laser beam 10 is heated, and information is recorded by a magnetic field generated from the pole tip 33 positioning within the heated area. The recording area has a width which is almost equal to the length of the pole tip 33 (hereinbelow, called "gap width") and a length which is almost equal to that of the magnetic gap 34 (hereinbelow, called "gap length").

On reproduction, by converting a change in magnetic flux entering the pole portion 32 when the magnetic gap 34 passes through a magnetic field leaked from the magnetic recording medium into a current by the coil 25, information recorded on the recording medium is reproduced.

According to the first embodiment, since the configuration in which the thin film magnetic transducer 20 is stacked on the semiconductor laser 2 is employed, the size of the magnetooptic device 1 is almost equal to that of the semiconductor laser 2. Thus, the very small magnetooptic device can be provided.

Since the magnetic recording medium is heated with the laser beam to thereby record information, recording can be performed to even a medium having a high coercive force at room temperature. The stability of recording can be therefore increased.

Since a recording mark can be irradiated with a laser beam at the time of reproduction as well, it is also possible to use a film made of TeFeCo or the like of which magnetization is weak at the room temperature but is increased by an increase in the temperature, and to enhance the reproduction sensitivity by the increase in the temperature. In this case, the semiconductor laser may be turned on either continuously or intermittently so as to be synchronized with recording mark positions. In the former case, since synchronization is unnecessary, a circuit to turn on the semiconductor laser can be simplified. In the latter case, the energy efficiency of the laser beam can be raised and a light emitting part can be prevented from being heated.

The distance from the coil 25 to the magnetic gap 34 can be shortened to about 10 µm or less, and the pole portion 32 can be widened, so that magnetic resistance can be reduced. Since the coil 25 is wound around the core 24 in a cylindrical shape, the coil length can be made shorter as compared with the case of winding the coil in a disc shape, and electric resistance can be accordingly reduced. Thus, high-speed high-density recording can be implemented.

Figure 2B:
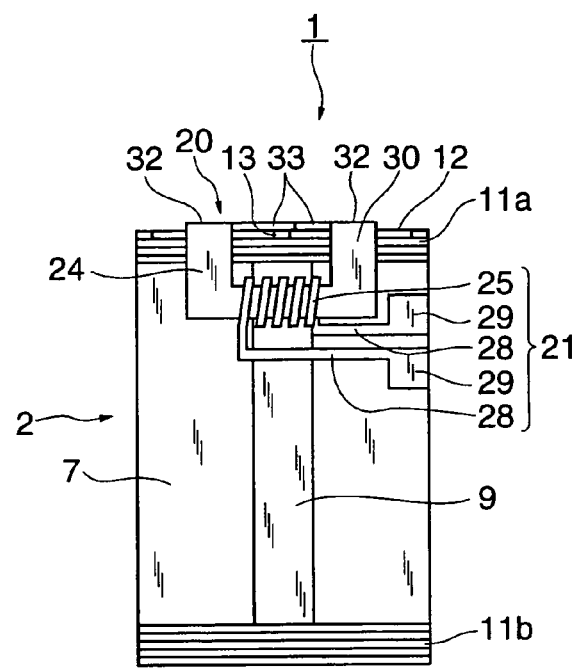

FIGS. 2A to 2C and FIGS. 3A to 3F show magnetooptic devices according to a second embodiment of the invention. As shown in FIGS. 2A and 2B, in the magnetooptic device 1, a shading body 22 having an opening 13 is formed on the laser beam output surface of the semiconductor laser 2 and the magnetic gap 34 is formed on the shading body 22. The other configuration is similar to that of the first embodiment. As the material of the shading body 22, Au can be used. Another metal material such as Ag or Al can also be used.

Figure 2C:
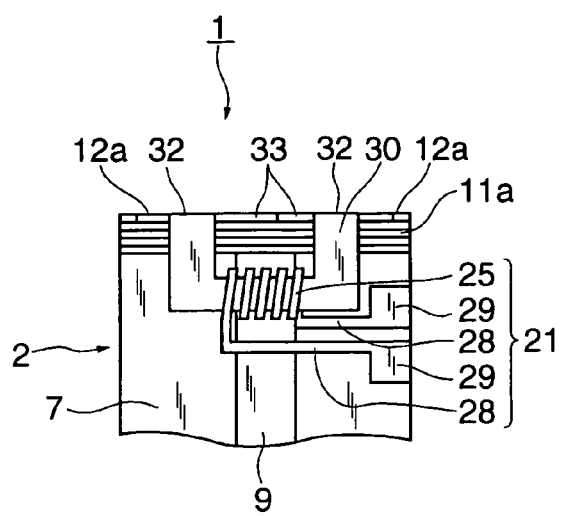
FIG. 2C is a top view of a modification.

As shown by the reference numeral 12a in FIG. 2C, the shading body may be formed so as to be flush with the pole portion 32 and so as to surround the pole portion 32. Consequently, since the opening 13 and the magnetic gap 34 are formed in the same plane, the processing accuracy of each of them can be raised.

Figure 3A:
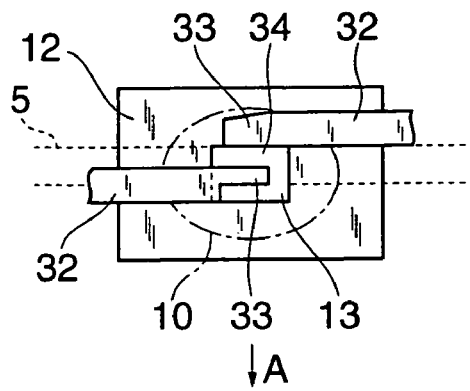
FIGS. 3A to 3F are diagrams showing other modifications of the magnetooptic device according to the second embodiment of the invention.

FIGS. 3A to 3F show modifications of the opening 13 and the gap portion 31. FIG. 3A shows an example in which the size of the opening 13 is larger than that of the magnetic gap 34. The opening 13 is formed so as to be wide on the recording upstream side A of the magnetic gap 34, so that an output of the laser beam can be made relatively large. Since the magnetic recording medium is heated just before a magnetic field is applied to the gap portion 31 and information is recorded in a state where the temperature of the medium is increased, heating can be efficiently performed.

Figure 3B:
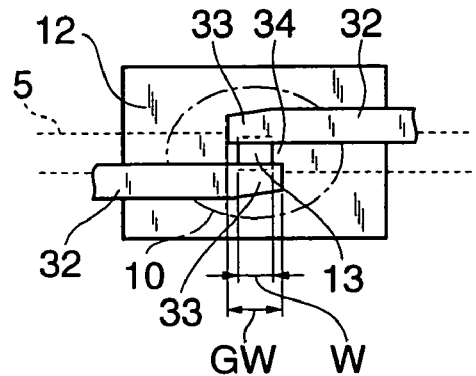

FIG. 3B shows an example in which the width W of the opening 13 is made narrower than the gap width GW. Consequently, the width of the portion to be heated in the magnetic recording medium can be made narrower than the gap width. A magnetic field usually expands from the pole tip 33 to the peripheral area, the recording width is widened by the leaked magnetic field as a result, and it is difficult to narrow the recording track width. In the example, widening of the recording width is not caused by a laser beam determined by the size of the opening 13. Consequently, higher-density recording can be realized.

Figure 3C:
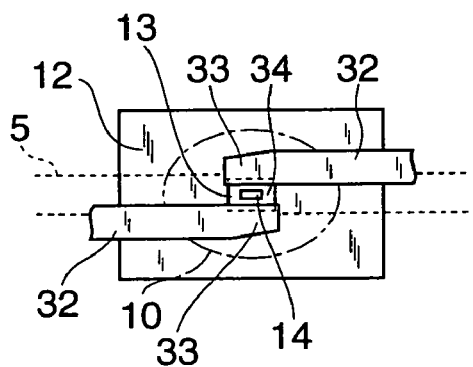

FIG. 3C shows an example in which a small metal body 14 smaller than the opening 13 is formed in the opening 13. By forming the opening 13 coaxially with the small metal body 14, even when the size of the opening 13 is as small as ⅟₁₀ of the wavelength of a laser beam, propagation light can be emitted and the intensity of the laser beam can be increased. A near field wave can be scattered by the small metal body 14 in the center and a near field wave emitted from a plasmon which is exited in the small metal body 14 can be used to increase the temperature of the recording medium, so that a laser beam of higher intensity can be used.

Figure 3D:
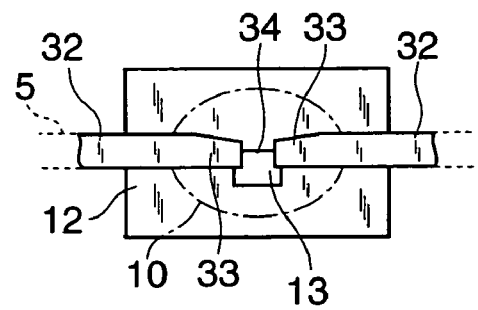

FIG. 3D shows an example in which the pair of pole tips 33 and 33 are formed so as to face each other. By the arrangement, the magnetic gap 34 and the pole portion 32 can be processed more finely, so that the magnetic field applying range can be narrowed. The opening 13 may be formed either largely so as to include the magnetic gap 34 or on the inside of the magnetic gap 34. By the arrangements, the recording range can be further narrowed and high-density recording can be implemented.

Figure 3E:
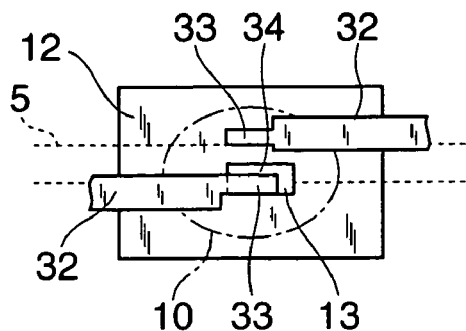
Figure 3F:
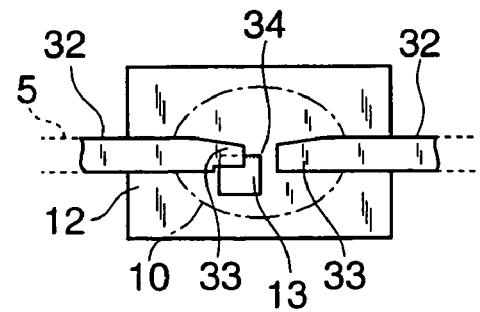

Each of FIGS. 3E and 3F shows an example in which the opening 13 is formed near to one of the pair of pole tips 33 and 33, only the magnetic recording medium around the pole tip 33 is heated, and the temperature rise around the other pole tip 33 is suppressed as much as possible. The magnetic field in the vertical direction to the magnetic gap 34 below the magnetic gap 34 (perpendicular direction to the drawing sheet) becomes maximum at each of the pole tips 33, and the magnetic field directions at the pole tips 33 are opposite to each other. With the configuration, therefore, only a part of the recording medium on which the magnetic field in one of the directions passes can be heated. The optically assisted magnetic recording can be therefore performed onto a small area, and recording density can be implemented. In the configuration, since only the magnetic field in the vertical direction with respect to the recording medium is used, a substantially single magnetic pole is formed. The configuration is especially suited to recording of information onto a vertical magnetic recording medium. Recording of information to the very small area in vertical magnetic recording can be implemented.

According to the second embodiment, effects similar to those of the first embodiment can be obtained. Since the size of the laser beam 10 is about that of the opening 13, the heated area can be narrowed and heating of the portion other than the recording portion of the recording medium can be reduced.

The laser beam in the portion other than the opening 13 is reflected by the shading body 12 to the laser, and contributes to the laser oscillation. The light utilizing efficiency can be therefore increased.

The overlap between the opening 13 and the magnetic gap 33 can limit the recording area. A recording mark smaller than that formed by each of the opening 13 and the magnetic gap 33 can be formed, so that higher recording density can be achieved. By overlapping the opening 13 and the magnetic gap 34, only the portion where the magnetic field in the vertical direction exists can be recorded. Thus, a magnetooptic head suitable for recording information onto a vertical magnetic medium can be obtained.

Figure 4A:
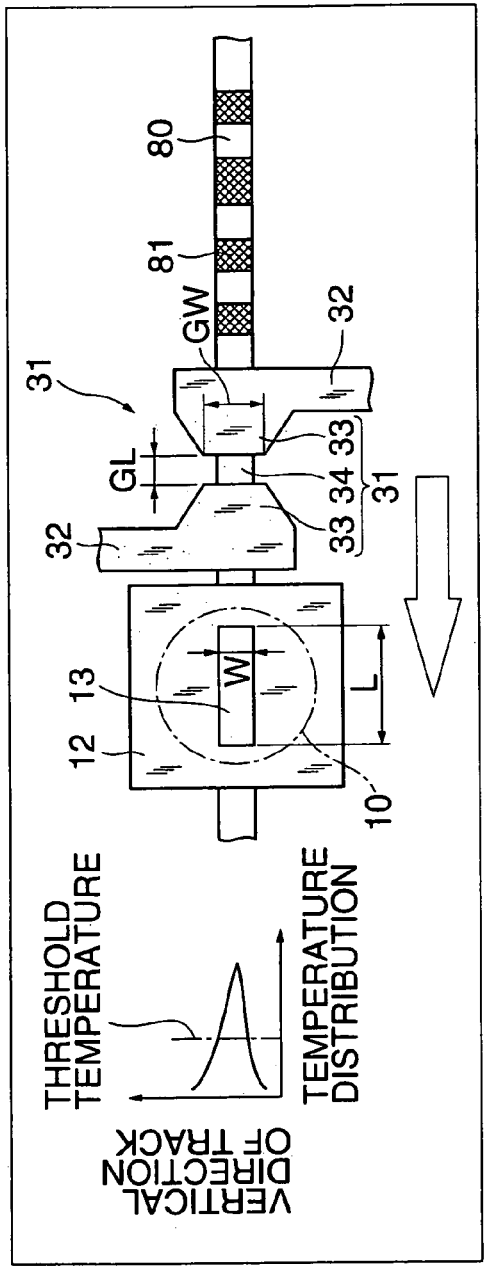
FIGS. 4A and 4B are diagrams each showing a magnetooptic device according to a third embodiment of the invention.
Figure 4B:
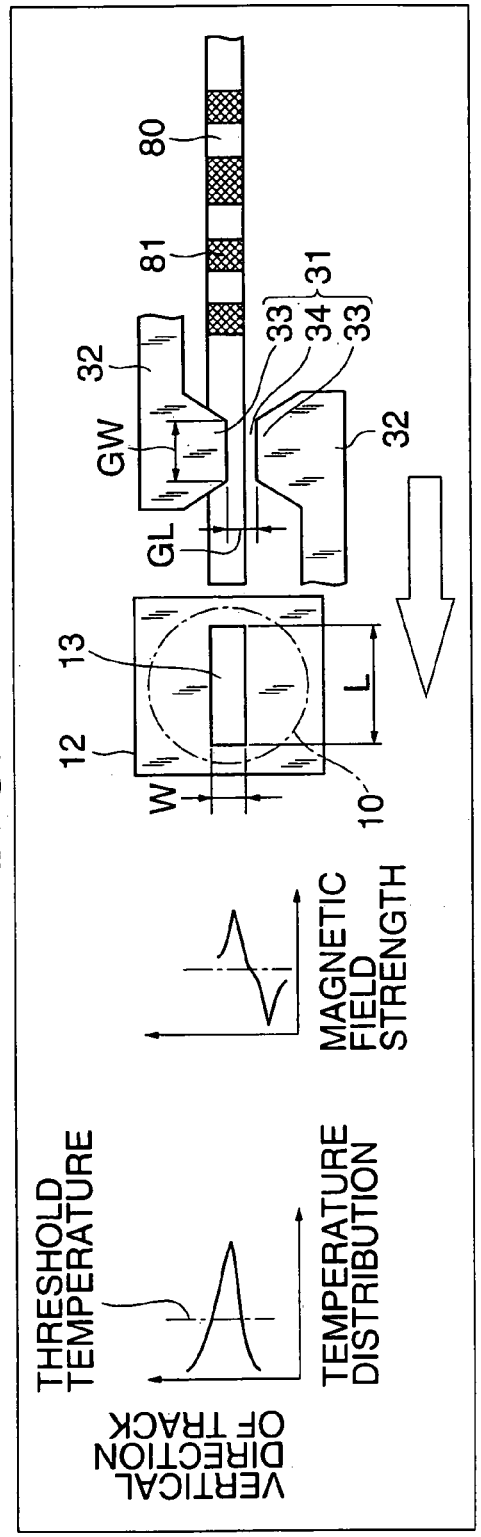

FIGS. 4A and 4B show magnetooptic devices according to a third embodiment of the invention. In the third embodiment, the opening 13 from which a laser beam is emitted is disposed in a position prior to the magnetic gap 34, and the opening 13 has a rectangular shape which is long along a recording track 80 and has sides which are vertical and parallel to the recording track 80.

In the case shown in FIG. 4A, the width W of the opening 13 is smaller than the spot diameter of the laser beam 10 and the gap width GW. The length L of the opening 13 is about equal to or larger than the radius of the spot of the laser beam 10. With the configuration, the recording track 80 in the magnetic recording medium is heated by the irradiation of the laser beam 10 prior to recording so that the coercive force is decreased to a proper value, and then magnetic recording is performed by using the magnetic field of the gap portion 31. Consequently, the mark length can be limited by the gap length GL and the track width can be limited by the width W of the opening 13 from which a laser beam is emitted. Thus, a smaller mark 81 can be achieved. By setting the length L of the opening 13 as described above, the intensity of the laser beam 10 emitted from the opening 13 largely increases. Although it is difficult to narrow the width of the recording magnetic field due to a leakage magnetic field in the lateral direction, since the recording width can be suppressed by the width W of the opening 13, the track width can be narrowed.

In the case shown in FIG. 4B, a vertical magnetic recording medium (especially, an amorphous recording medium made of TbFeCo or the like) is used. The magnetic gap 34 is disposed in parallel with the recording track 80. The width W of the opening 13 is about equal to or narrower than the spot diameter of the laser beam 10 or the gap length GL. The length L of the opening 13 is about the radius of the spot of the laser beam 10 or longer. As shown in FIG. 4B, the opening 13 becomes the maximum in the magnetic gap 34 just below the pole tip 33, and the pole tips 33 are in the opposite directions. With the configuration, the recording track 80 in the magnetic recording medium is heated by being irradiated with the laser beam 10 prior to recording, thereby reducing the coercive force to a proper value. After that, the vertical magnetic recording is performed by the magnetic field of the gap portion 31. The track width can be limited by the width W of the opening 13 through which the laser beam 10 is emitted and the width of the vertical pole just below the gap portion 31. The track width can be narrowed to about ⅓ of the gap length GL or narrower. In the recording, the mark length can be determined by the modulating speed of the magnetic field and the rotational speed of the disk. That is, in the case where the disk rotational speed is low and the travel distance per cycle of the magnetic field is shorter than the gap width GW, recording is carried out while erasing the rear portion of the recorded mark 81 by the subsequent magnetic field in the opposite direction. By the technique, density recording can be implemented. By setting the length L of the opening 13 as descried above, the intensity of the laser beam emitted through the opening 13 is largely increased. In the case of using a recording medium made of a ferrimagnetic material such as TbFeCo, the magnetization increases by being heated. In the second embodiment, in a manner similar to the first embodiment, by irradiating the recording medium with a laser beam at the time of reproduction, the sensitivity can be increased. In this case, the semiconductor laser can be turned on either continuously or intermittently so as to synchronize with the recording mark positions. In the former case, because of no necessity of the synchronization, a circuit for turning on the laser can be simplified. In the latter case, the energy efficiency of the laser beam can be raised and the light emitting portion can be prevented from being heated. Obviously, when a recording medium having a relatively small coercive force is used, information can be recorded only by a magnetic field by using the head of the embodiment without applying a laser beam.

Figure 5A:
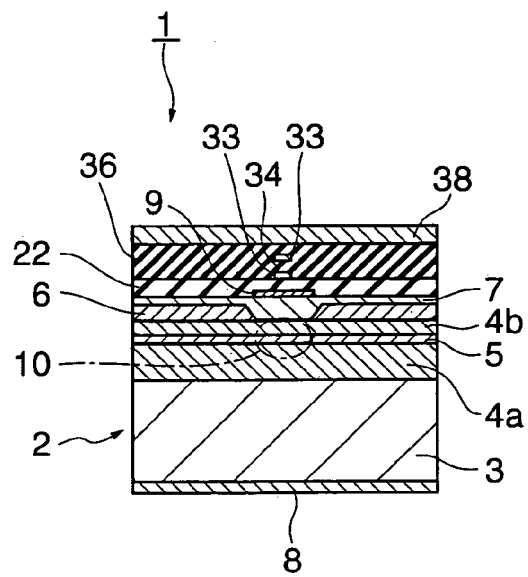
FIGS. 5A, 5B and 5C are, respectively, an end view showing a laser beam output surface, a top view, and a section view seen from a side face direction of a magnetooptic device according to a fourth embodiment of the invention.
Figure 5B:
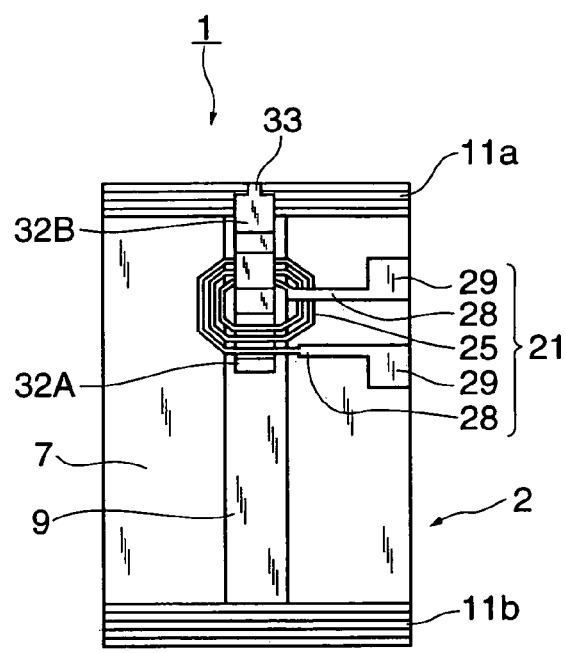
Figure 5C:
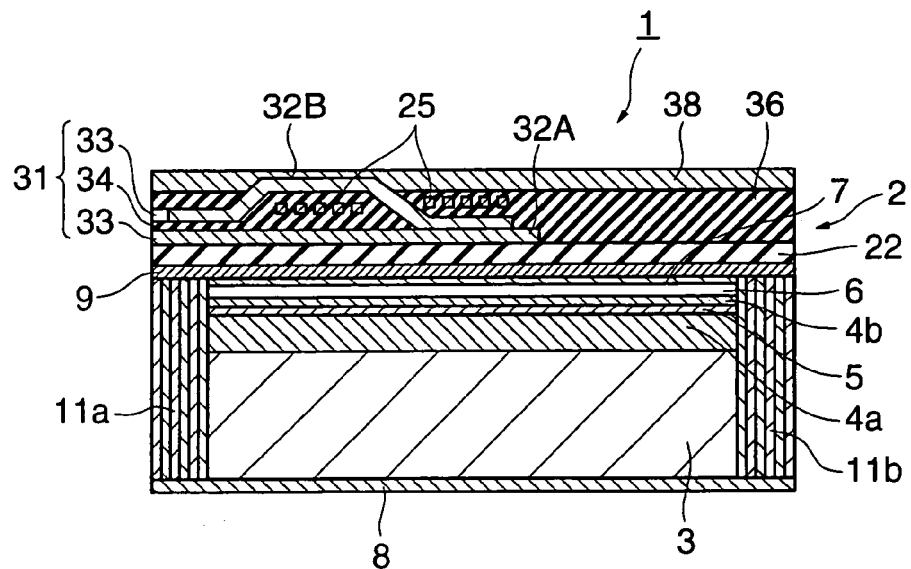

FIGS. 5A, 5B and 5C are, respectively, an end view showing a laser beam output surface, a top view, and a cross section seen from a side face direction of a magnetooptic device according to a fourth embodiment of the invention. According to the fourth embodiment, the semiconductor laser 2 similar to that of the first embodiment is used and the thin film magnetic transducer 20 is disposed on the top face of the laser 2.

An example of the method of fabricating the magnetooptic device 1 will now be described. After forming the semiconductor laser 2, the p-type electrode 9 is embedded flatly in the insulating film 22 made of $SiO_2$ or the like. After that, a bottom pole 32A and its pole tip 33 are formed by a magnetic film by sputtering and photolithography and planarized by an insulating film 36. After forming the magnetic gap 34, the coil 25, a top pole 32B, and the pole tip 33 of the top pole 32B are formed by repeating sputtering and photolithography and, finally, covered with a protective film 38, thereby completing the magnetooptic device 1.

According to the fourth embodiment, as shown in FIG. 5C, the pole tips 33 and the magnetic gap 34 are formed in the output face of the laser 2. Although the magnetic gap 34 and the output position of the laser beam 10 do not coincide with each other, the distance between them is as narrow as about 1 µm and it is not always necessary to use a fundamental mode as the mode of the laser oscillation. Consequently, the p-type cladding layer 4b and the cap layer 7 in the laser 2 can be thinned, and the distance between the magnetic gap 34 and the output position of the laser beam 10 can be further narrowed. At the time of recording, by disposing so that the recording face (not shown) is irradiated with the laser beam 10 prior to the magnetic gap 34, the temperature of the recording portion is increased by the laser beam. In a state where the coercive force is sufficiently low, recording can be made by the pole tips 33.

It is sufficient to form the partly transmitting film 11a and the high reflecting film 11b for a conventional resonator in the end face of the laser 2. The process can be therefore largely simplified.

Figure 6A:
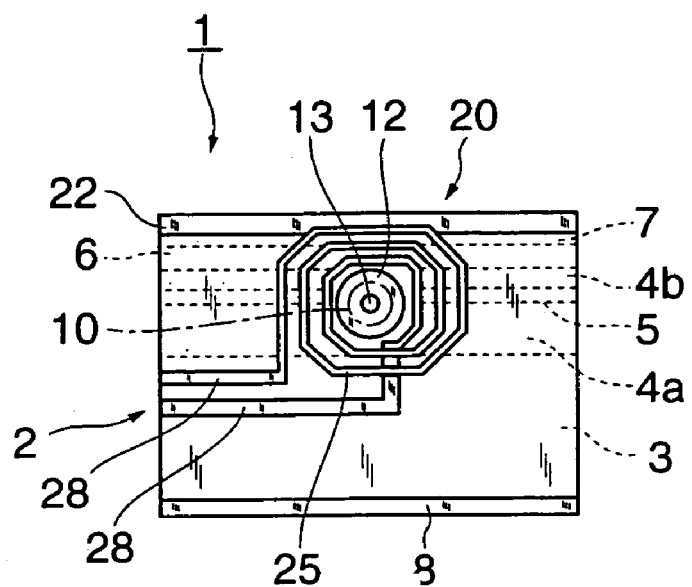
FIGS. 6A and 6B are, respectively, an end view showing a laser beam output surface and a top view of a magnetooptic device according to a fifth embodiment of the invention.
Figure 6B:
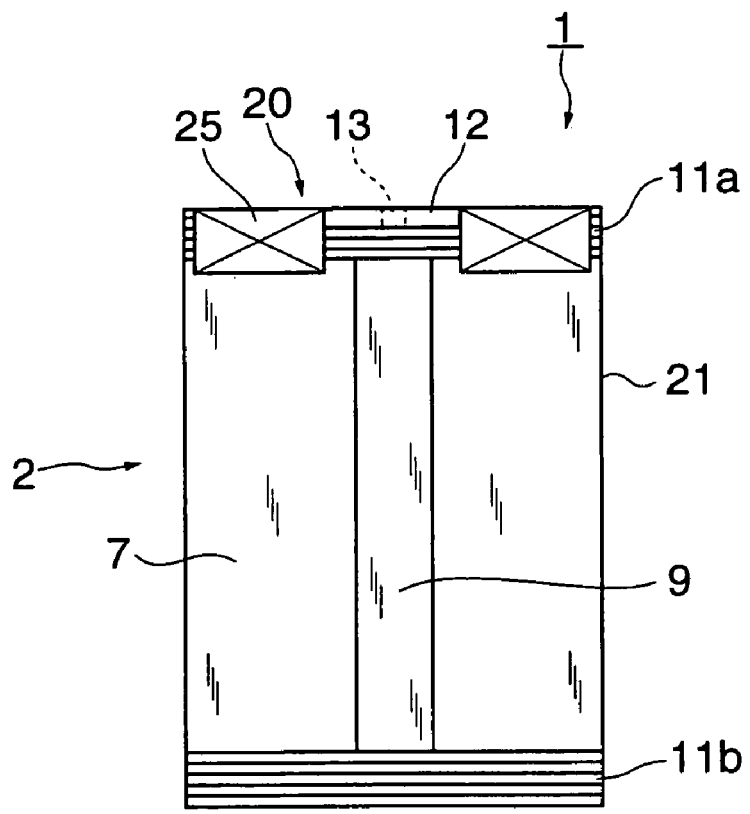

FIGS. 6A and 6B are, respectively, an end view and a top view of a laser beam output surface of a magnetooptic device according to a fifth embodiment of the invention. In the fifth embodiment, the semiconductor laser 2 similar to that of the first embodiment is used. The coil 25 in the thin film magnetic transducer 20 is disposed on the laser beam output surface of the laser 2, and the shading body 12 which is made of a material having a high magnetic permeability such as Permalloy and which has the opening 13 is disposed on the inside of the coil 25. According to the fifth embodiment, the intensity of the magnetic field can be increased by the shading body 12, and the size of the laser beam 10 emitted from the laser beam output surface can be reduced by the opening 13. Although the opening 13 has a circular shape in the embodiment, it can have a rectangular shape. In the case of the rectangular shape, by setting the sides so as to be parallel to or vertical to the recording tracks, recording density can be improved in comparing with the circular case.

Figure 7A:
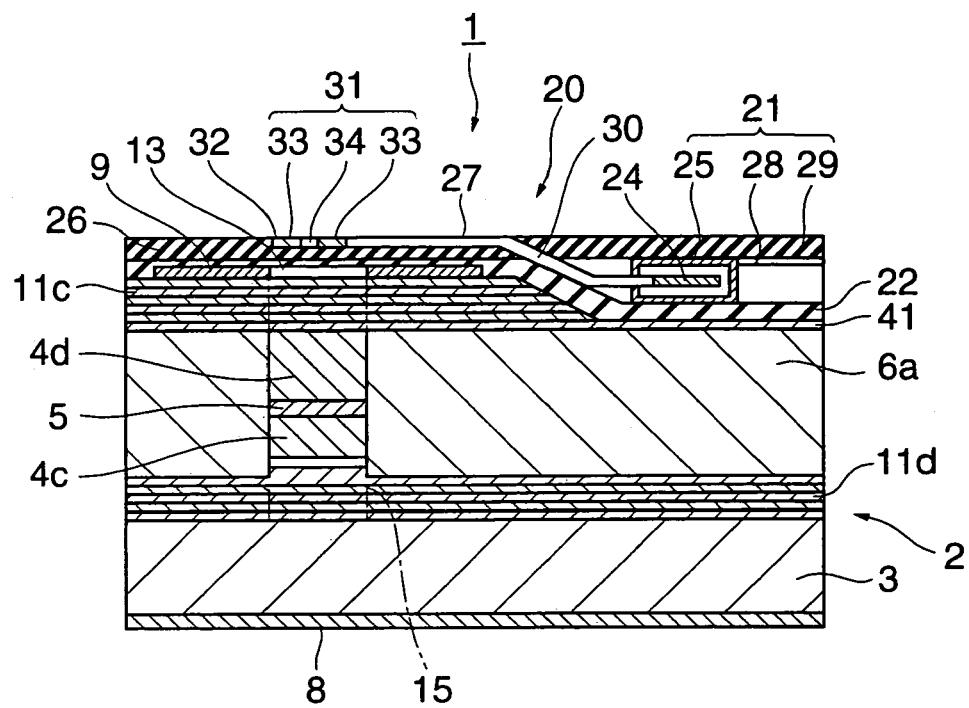
FIGS. 7A and 7B are, respectively, a section view showing a main portion and a top view showing a laser beam output surface of a magnetooptic device according to a sixth embodiment of the invention.
Figure 7B:
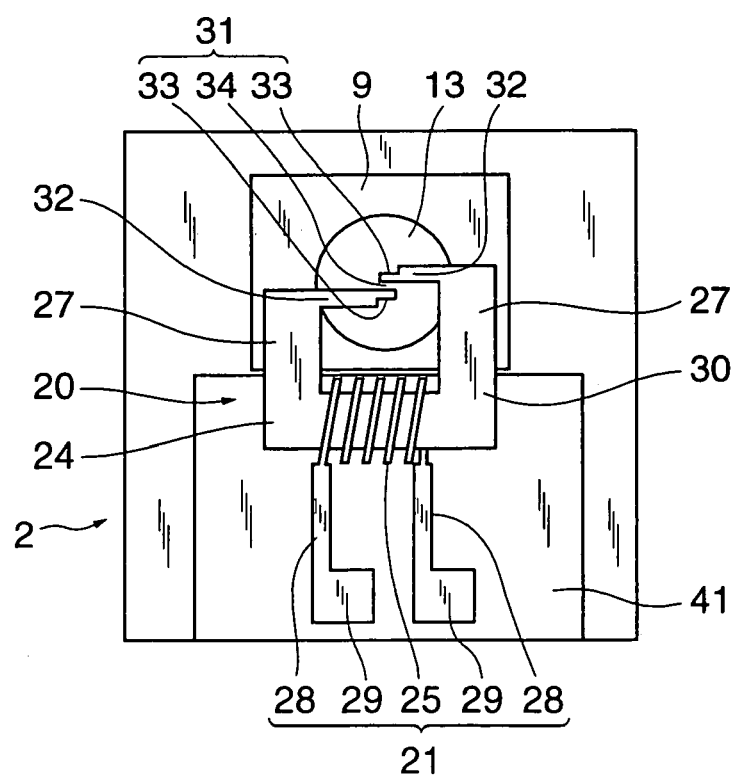

FIG. 7A is a section view of a main portion of a magnetooptic device according to a six embodiment of the invention, and FIG. 7B is a top view showing the laser beam output surface. In the six embodiment, the magnetooptic device has: the semiconductor laser 2 which takes the form of a vertical cavity surface emitting semiconductor laser (VCSEL) for performing oscillation in the vertical direction to the active layer; and the thin film magnetic transducer 20 stacked on the laser beam output surface side of the laser 2.

As the semiconductor laser 2, a red laser of an AlGaInP (wavelength of 650 nm) is used in a manner similar to the first embodiment. However, the invention is not limited to the laser but an infrared laser or a blue laser can also be used. The semiconductor laser 2 has an n-type semiconductor multilayer 11d for a resonator, an n-type spacer layer 4c, an active layer 5, a p-type spacer layer 4d, a p-type semiconductor multilayer 11c for the resonator, an n-type electrode 8 and a p-type electrode 9 which are sequentially formed on the substrate 3 made of GaAs.

An example of a method of fabricating the magnetooptic device 1 will be described. First, the semiconductor laser 2 is fabricated. To be specific, the n-type semiconductor multilayer 11d for the resonator, n-type spacer layer 4c, active layer 5, p-type spacer layer 4d, and p-type semiconductor multilayer 11c for the resonator are sequentially crystal grown on the substrate 3 made of GaAs. After that, ions are implanted in a portion 6a other than an oscillation region 15 so that the portion 6a is highly resistive. Further, the n-type electrode 8 and the p-type electrode 9 are formed, thereby completing the laser 2. The output diameter of the laser beam is determined by the opening 13 of the p-type electrode 9 or the diameter of the ion implanted region 6a and is, for example, 3 to 5 μm. The magnetic circuit 30 is formed in the laser beam output surface by reactive ion etching. A recess 41 is formed in the p-type semiconductor multilayer 11c. The p-type electrode 9 is buried by planarization in the insulating film 22 made of $SiO_2$ or the like. In a manner similar to the first embodiment, the bottom coil 25a, core 24, top coil 25b, wire 28, and electrode pad 29 are sequentially buried in the insulating film 22, thereby forming the coil portion 21. The gap portion 31 is formed in the laser beam output position. In such a manner, the magnetooptic device 1 of the embodiment is completed.

According to the six embodiment, in a manner similar to the fourth embodiment, the coil portion 21 and the gap portion 31 can be continuously formed so as to be flush with each other, so that the process can be simplified. The position of the magnetic gap 34 and the laser beam output position can be made to coincide with each other, so that the magnetic recording medium can be efficiently heated. The magnetic gap 34 is formed so as to be surrounded by the opening 13 as the laser beam outputting position. Consequently, the heating can be performed to sufficiently decrease the coercive force of a recording medium even by the vertical cavity surface emitting semiconductor laser of a relatively low output. The gap portion 31 may also be formed by being embedded in the p-type semiconductor multilayer 11c for the resonator. In this case, for protecting the surface of the multilayer 11c, a dielectric film may be formed within or on the magnetic gap 34. By setting the thickness of the dielectric film to a quarter of the wavelength, it is also possible to make the dielectric film also serve as an antireflection film.

Figure 8A:
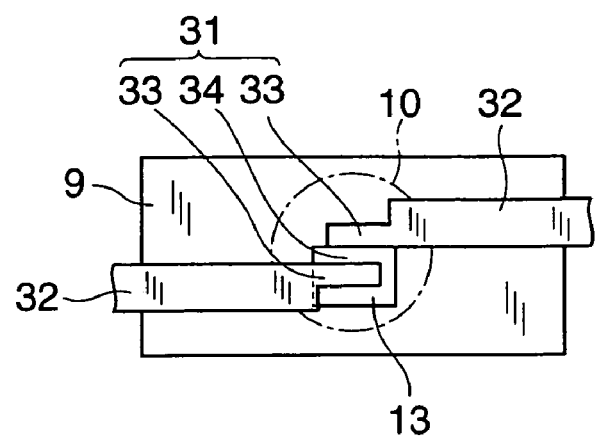
FIGS. 8A and 8B are views each showing a modification of the sixth embodiment.
Figure 8B:
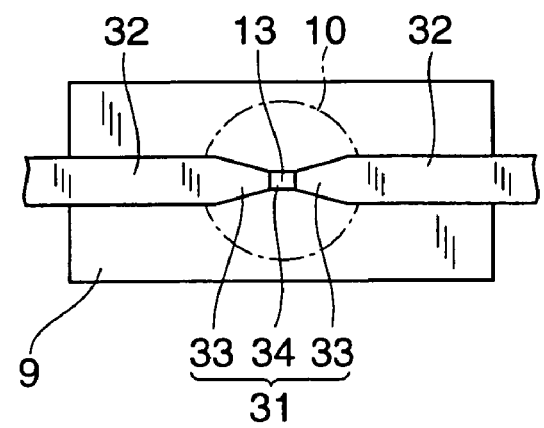

FIGS. 8A and 8B show modifications of the gap portion 31 illustrated in FIGS. 7A and 7B. In FIG. 8A, in a manner similar to FIG. 3A, the shading body (which can also serve as a p-type electrode) 12 is used and the opening 13 is formed around the magnetic gap 34. By the arrangement, the recording portion can be efficiently heated. Although not shown, the shapes similar to those in FIGS. 3B, 3C and 3E can also be used. By using the shapes, effects similar to those of the modifications of the second embodiment can be obtained. In FIG. 8B, in a manner similar to FIG. 3D, the pole tips 33 are formed so as to face each other, so that the pole tip 33 and the magnetic gap 34 can be formed in a smaller size. Although not shown, by forming the opening 13 only one of the sides of the pair of the pole tips 33 and heating only the portion corresponding to the opening 13 in the recording medium as shown in FIG. 3F, higher-density optically assisted magnetic recording can be implemented.

Figure 9A:
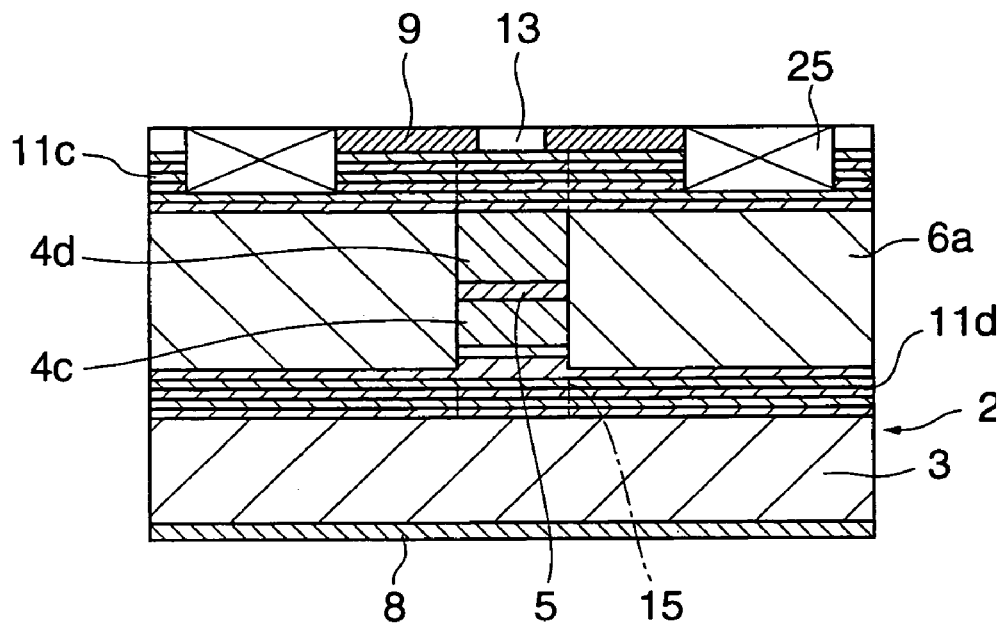
FIGS. 9A, 9B and 9C are, respectively, a section view showing a main portion, a top view showing a laser beam output surface, and a view showing a modification of a magnetooptic device according to a seventh embodiment of the invention.
Figure 9B:
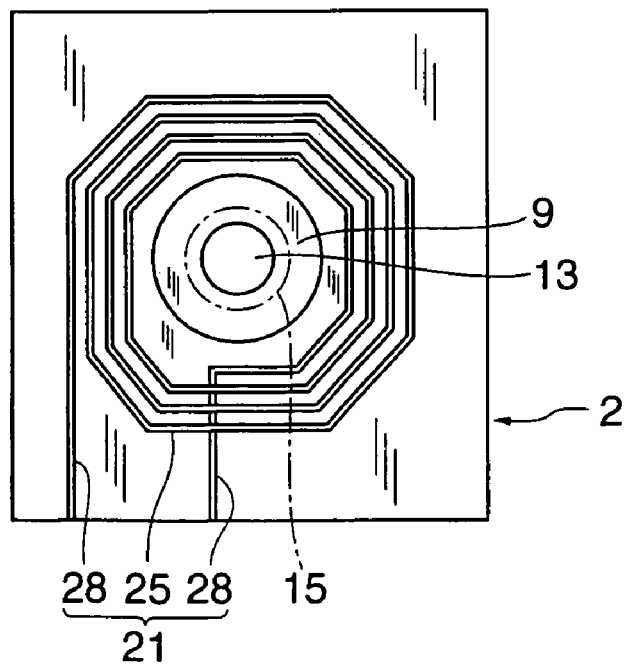
Figure 9C:
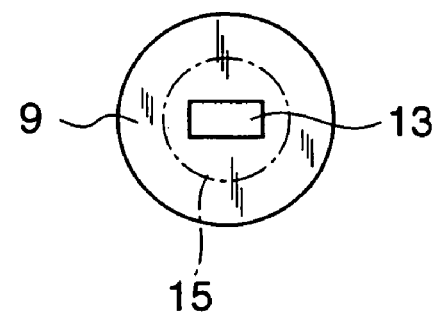

FIGS. 9A to 9C show a magnetooptic device according to a seventh embodiment of the invention. In the seventh embodiment, the coil 25 in the thin film magnetic transducer 20 is disposed on the laser beam output surface of the semiconductor laser 2 which takes the form of a vertical cavity surface emitting semiconductor laser, and the p-type electrode 9 which is made of a material having a high magnetic permeability such as Permalloy and which has the opening 13 is disposed on the inside of the coil 25. The shape of the opening 13 may be a circle smaller than the size of the oscillation region 15 or a rectangular shape as shown in FIG. 9C. According to the seventh embodiment, effects similar to those of the fifth embodiment can be obtained.

Figure 10A:
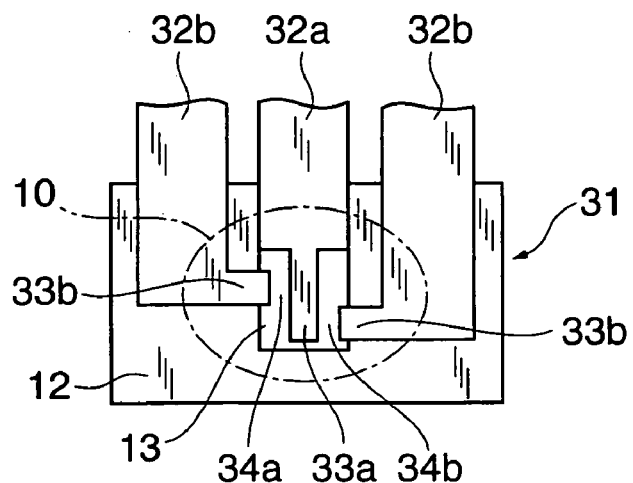
FIGS. 10A, 10B and 10C are diagrams each showing a gap portion and an opening of a magnetooptic device according to an eighth embodiment of the invention.
Figure 10B:
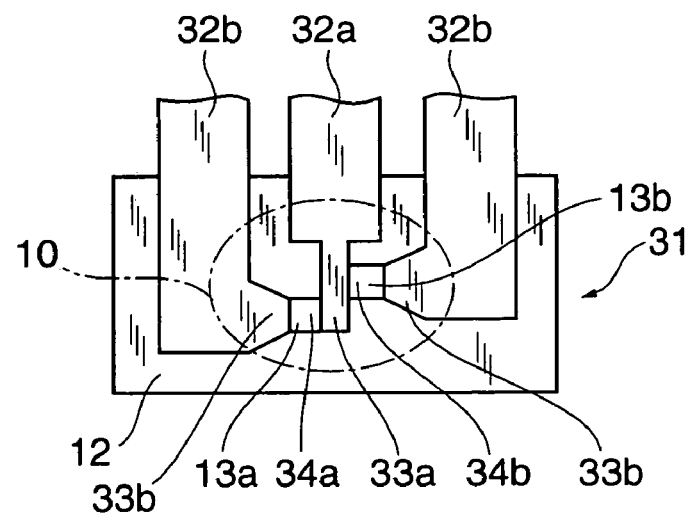
Figure 10C:
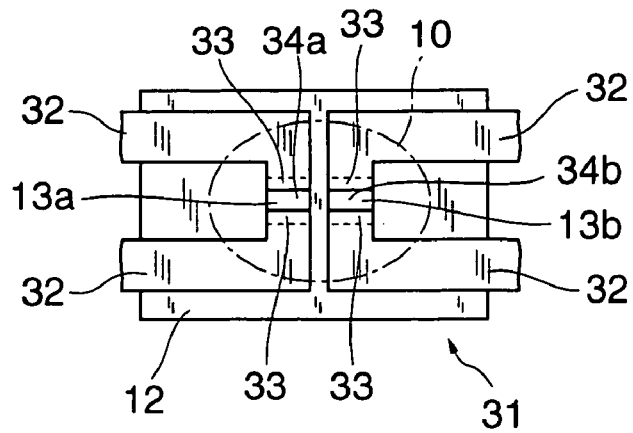

FIGS. 10A to 10C show magnetooptic devices according to an eighth embodiment of the invention. In the eighth embodiment, the magnetooptic device has: the shading body 12 having an opening formed on the laser beam output surface side of an edge emitting semiconductor laser; a magnetic circuit (not shown) having two magnetic gaps 34a and 34b on the opening 13 of the shading 12; and a coil portion (not shown) for detecting each of changes in magnetic fluxes entering the two magnetic gaps 34a and 34b.

Referring to FIG. 10A, the magnetooptic device has a common pole 32a positioning in the center and individual poles 32b positioning on both sides of the common pole 32a. By commonly using a pole tip 33a in the center, pole tips 33b are formed via magnetic gaps 34a and 34b on the right and left sides. Although the coil portion has independent two coils, the core center portion is connected to the common pole 32a, thereby simplifying the structure. The shading body 12 has a single opening 13. The magnetic gaps 34a and 34b are simultaneously irradiated with a laser beam emitted through the single opening 13. Since the two gaps each can independently modulate the magnetic field are formed so as to be close to each other, information can be recorded/reproduced simultaneously to/from the neighboring two recording tracks (not shown), so that the transfer rate for recording/reproduction can be increased twice. The number of magnetic gaps is not limited to two but can be increased according to applications. The magnetic gap may be formed on a vertical cavity surface emitting semiconductor laser. In this case, the shading body 12 can also serve as an electrode.

FIG. 10B is a modification of FIG. 10A. In FIG. 10B, two openings 13a and 13b are formed on a diagonal line in the shading body 12, and the magnetic gaps 34a and 34b are disposed on the two openings 13a and 13b. By the arrangement, the recording region can be specified by the size of the openings 13a and 13b, so that the recording region can be narrowed and higher-recording density can be achieved.

FIG. 10C shows another modification of FIG. 10A, in which the two openings 13a and 13b are formed so as to face each other in the shading body 12 and the magnetic gaps 34a and 34b are formed on the two openings 13a and 13b by four poles 32. By the arrangement, the degree of freedom in constructing the magnetic circuit can be increased. Since two cores (not shown) are disposed to face each other, the modification is especially suited to be applied to a vertical cavity surface emitting semiconductor laser.

Figure 11:
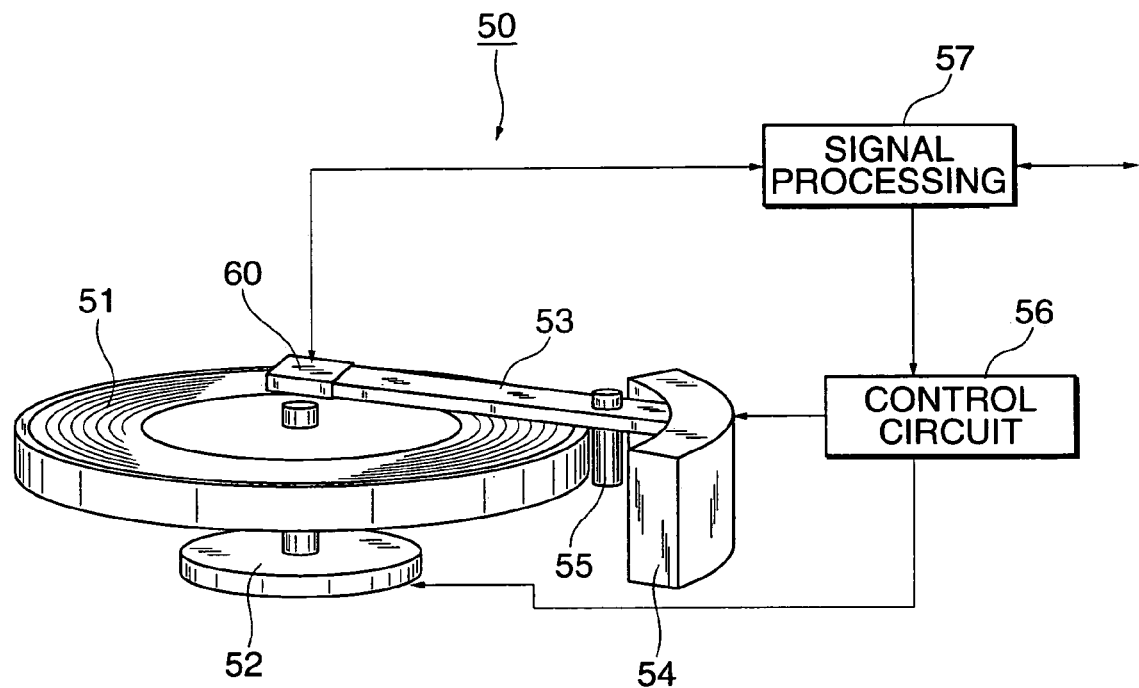
FIG. 11 is a perspective view of a magnetic disk drive according to a ninth embodiment of the invention.

FIG. 11 shows a magnetic disk drive according to a ninth embodiment of the invention. A magnetic disk drive 50 has: a magnetic disk 51; a motor 52 for rotating the magnetic disk 51; a magnetooptic head 60; a swing arm 53 for supporting the magnetooptic head 60 so as to be scanned around a rotary shaft 55 as a center; a linear motor 54 for operating the magnetooptic head 60 via the swing arm 53; a control circuit 56 for controlling the above elements; and a signal processing circuit 57 for processing a recording signal and a reproduction signal. The magnetooptic head 60 flies and travels over the magnetic disk 51 which is rotated at a predetermined rotational speed by the control circuit 56 and, while tracking predetermined recording tracks, records and reproduces information. Although one magnetic disk 51 is shown in FIG. 11, what is called a Winchester disk in which plural disks are stacked may also be used.

Figure 12A:
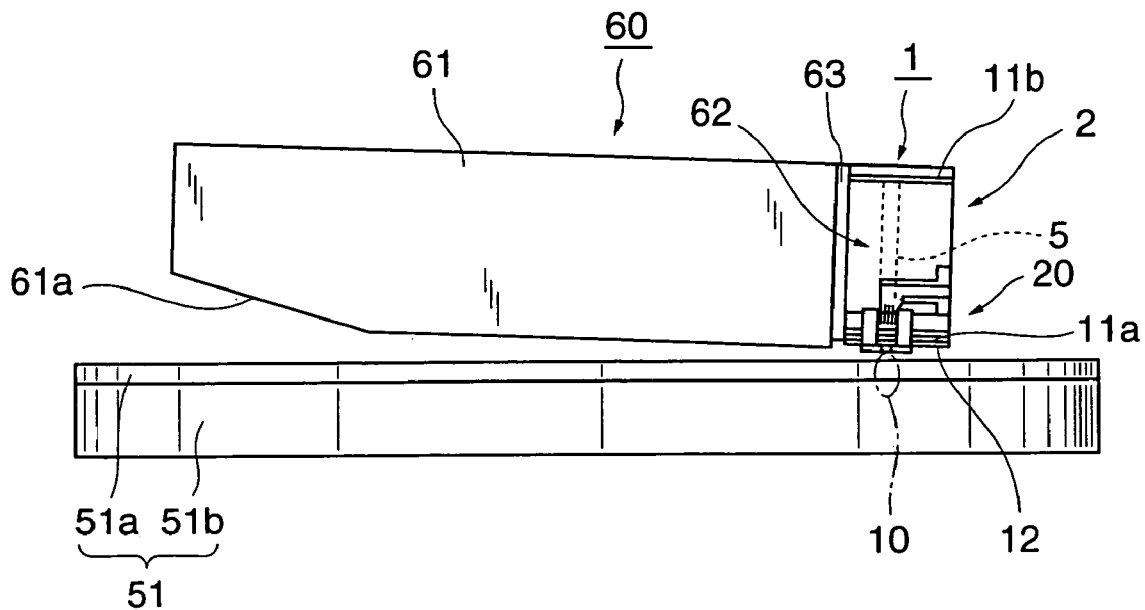
FIGS. 12A and 12B are, respectively, a side view and a bottom view of a magnetooptic head according to the ninth embodiment.

FIG. 12A shows a magnetooptic head used for the magnetic disk drive 50 shown in FIG. 11. In the magnetooptic head 60, the magnetooptic device 1 of the second embodiment is bonded to a rear portion 62 of a flying slider 61 for the magnetic head for use in a magnetic head disk drive in such a manner that the active layer 5 is parallel to the rear face of the slider 61 on the coil portion 21 side. The magnetic gap 34 is therefore disposed so as to be perpendicular to recording tracks (not shown) on the magnetic disk 51. The flying slider 61 and the magnetooptic device 1 are bonded by metallizing their bonding faces with an adhesive 63 which is an alloy film made of AuSn or the like and bonding the bonding faces by heating and using supersonic waves.

Figure 12B:
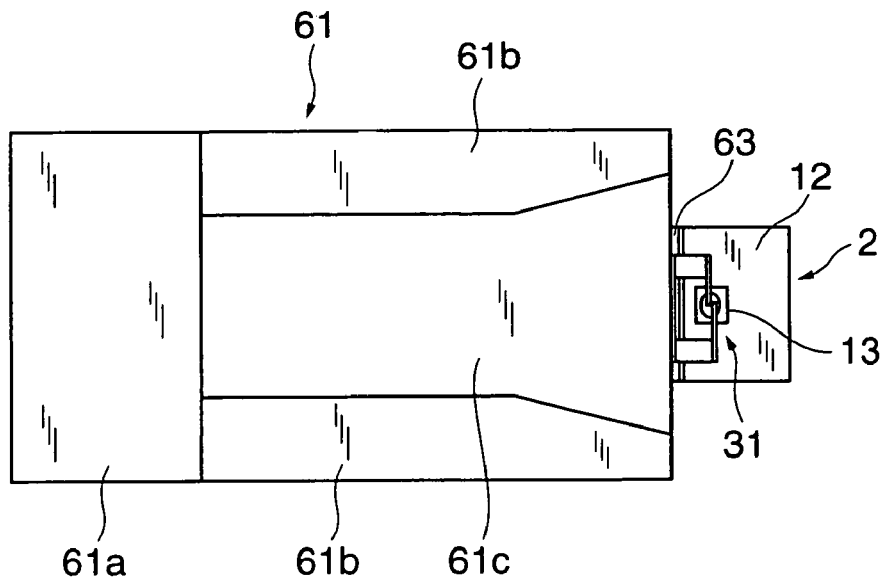

As shown in FIG. 12B, the flying slider 61 has an inclined tip portion 61a, right and left projections 61b and a recess 61c formed between the projections 61b. By the projections 61b and the recess 61c, a positive pressure and a negative pressure are created with respect to the magnetic disk 51, the flying slider 61 stably flies with a flying height of few tens nm.

The magnetic disk 51 is obtained by forming a magnetic recording medium 51a made of TeFeCo for a magnetooptic disk, whose compensation temperature is around room temperature, on the surface of a disk substrate 51b. The coercive force at room temperature of the medium 51a is 20 kOe which is much higher as compared with that of a medium made of CoCr or the like for regular magnetic recording by almost one digit, and the medium 51a is stable at room temperature. By heating the medium to 200° C. or higher so as to be close to the Curie temperature by application of the laser beam 10, the coercive force decreases to almost zero, so that information can be sufficiently recorded by the thin film magnetic transducer 20. The magnetization of the medium 51a becomes ten times or more (100 emu/cc) at about 200° C. as compared with that at room temperature. On reproduction as well, by heating the medium by the irradiation of the laser beam, signals can be reproduced at a sufficiently high signal-to-noise ratio by the thin film magnetic transducer 20. The recording medium 51a can also be made of a material such as CoCr for conventional in-plane recording. In this case as well, by heating the recording medium 51a, the coercive force can be decreased. Consequently, the embodiment is especially effective on recording and reproduction using the medium of which coercive force at room temperature is increased by adding Ta, Pd or the like.

The gap portion 31 is not limited to that used in the embodiment but various gap portions 31 shown in FIGS. 3A to 3F can be applied. By employing the modifications, the irradiation area of the laser beam can be reduced, or the irradiation position in the recording medium, that is, the position in which the coercive force decreases can be specified by the size of the opening 13. Consequently, high density recording can be implemented. In the case of using the gap portion 31 shown in FIG. 3D or 3F, in order to dispose the magnetic gap 34 so as to be orthogonal to tracks (not shown) of the magnetic disk 51, the active layer 5 in the laser 2 of the magnetooptic device is disposed so as to be perpendicular to the rear face of the disk 51. In the case of using the gap portion 31 shown in FIG. 3E or 3F, only the magnetic field in the vertical direction near one of the pole tips 33 can be used for recording. Consequently, it is suited for recording using a vertical recording film, especially, a magnetooptic recording film made of TeFeCo or the like. The width of the portion where the magnetic field is sharp is equal to or narrower than ⅓ of the gap length. Consequently, the recording density can be increased by three times or more. Further, in the case of using the gap portion 31 shown in FIG. 3E or 3F, the direction of the magnetic gap 34 may be disposed parallel to the recording tracks. In this case, the opening 13 is arranged so as to be prior to the magnetic gap 34. By such an arrangement, the width of the recording mark can be reduced to ⅓ of the opening 13 or narrower, so that the track width can be largely narrowed. In magnetic recording, the length of the recording mark is determined by the rotational speed of the disk and the frequency of the recording signal. By increasing the frequency, a mark having the length which is equal to or shorter than the gap length can be formed. The width of a track is determined by the gap width. In practice, due to expansion of the magnetic field around the gap, the track width becomes the gap width or wider. However, by disposing the magnetic gap 34 in the above-described direction and recording information by heating the disk with the laser beam which goes out from the opening 13, the recording mark much smaller than the actual gap size can be formed, so that high density recording can be achieved. By emitting a pulse laser beam synchronously with a modulated magnetic field generated in the gap portion 31 at the time of recording and synchronously with a sync signal (not shown) in a recording track at the time of reproduction, the recording mark can be made steeper and smaller and the power efficiency can be raised.

Since tracking of the recording tracks in the embodiment uses the irradiation of a laser beam, a track position error signal may be generated by using an effect of modulating the oscillating state of a laser by the reflection light returned to the resonator of the semiconductor laser, that is, a self coupling effect. The track position error signal may also be formed by using modulation of the magnetic field intensity due to a track deviation by the thin film magnetic transducer. Although the magnetooptic device 1 of the second embodiment is used as the magnetooptic device 1 in the ninth embodiment, the invention is not limited to the magnetooptic device 1 but any of the other magnetooptic devices in the other embodiments may be used. By using the magnetooptic device of the eighth embodiment, higher recording density and higher transfer rate can be achieved.

According to the ninth embodiment, the magnetooptic head which is almost the same as that used in a conventional magnetic hard disk drive can be provided. The optically assisted magnetic recording apparatus having high volume recording density can also be provided. Since the small magnetooptic head can be fabricated, high speed tracking can be performed. Information can be simultaneously recorded/reproduced to/from plural tracks, so that the higher transfer rate at the time of recording and reproduction can be achieved.

Figure 13:
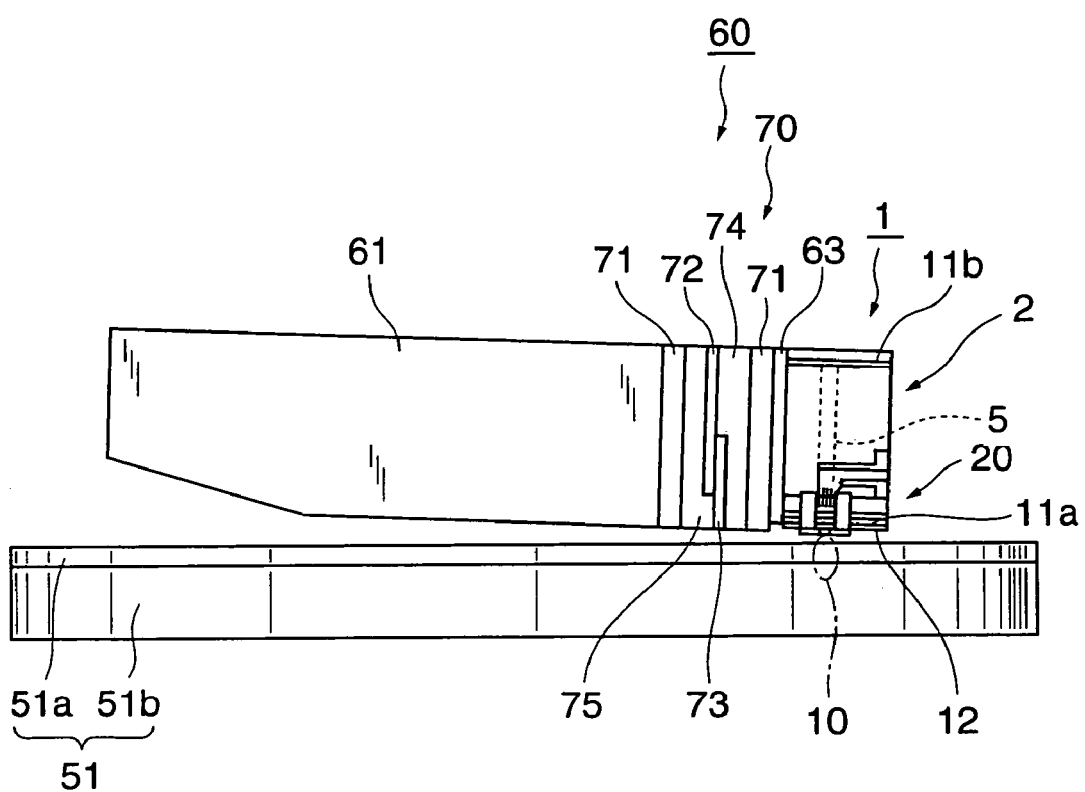
FIG. 13 is a diagram showing a magnetooptic head according to a tenth embodiment of the invention.

FIG. 13 shows a magnetooptic head according to a tenth embodiment of the invention. A magnetooptic head 60 is obtained by forming a magnetic sensor 70 which is a GMR (Giant Magneto Resistive sensor) between the flying slider 61 and the magnetooptic device 1 in the magnetooptic head of the ninth embodiment shown in FIG. 12 by using the thin film process.

The magnetic sensor 70 is constructed by a spin valve 73 and an electrode 72 as a magnetic field detecting part which is sandwiched by magnetic shielding films 71 via insulating films 74 and 75. The magnetic sensor 70 can sense a very small magnetic field with high sensitivity.

In the embodiment, since the GMR sensor 70 is used for signal reproduction, the medium is not heated at the time of reproduction. A medium made of CoCrTa, GaFeCo or the like, having large magnetization at normal temperature is used. Any of the magnetooptic devices in the other embodiments can be employed. Since the GMR sensor is, however, sensitive to heat, an insulating layer is sandwiched in the adhesive 63 to improve thermal insulation. A short pulse laser beam is used as the laser beam at the time of recording.

According to the tenth embodiment, a magnetic field can be detected with high sensitivity by the GMR sensor. Consequently, not only high recording density but also recording and reproduction at high transfer rate can be implemented.

Figure 14A:
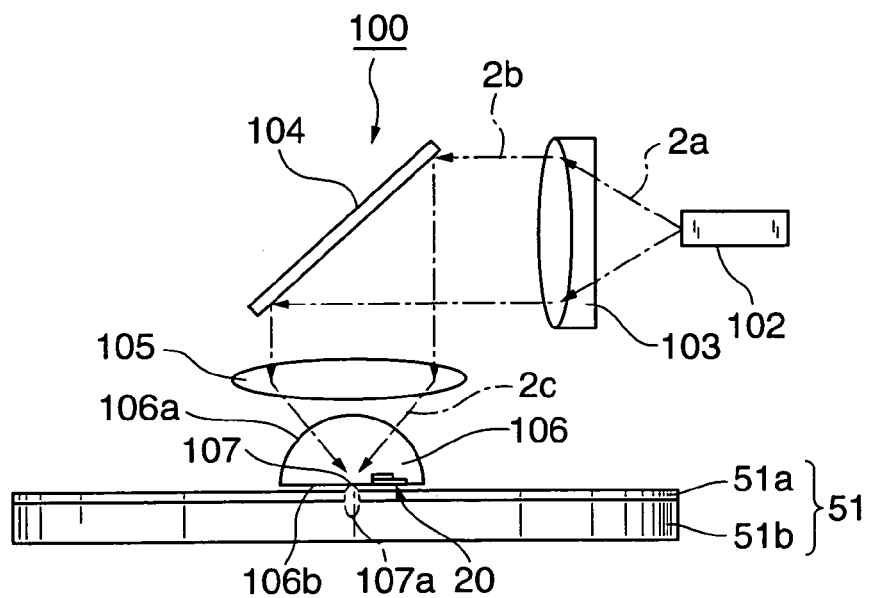
FIGS. 14A, 14B and 14C are, respectively, a section view seen from a side face, a bottom view, and an enlarged view of the bottom face of a magnetooptic head according to an eleventh embodiment of the invention.
Figure 14C:
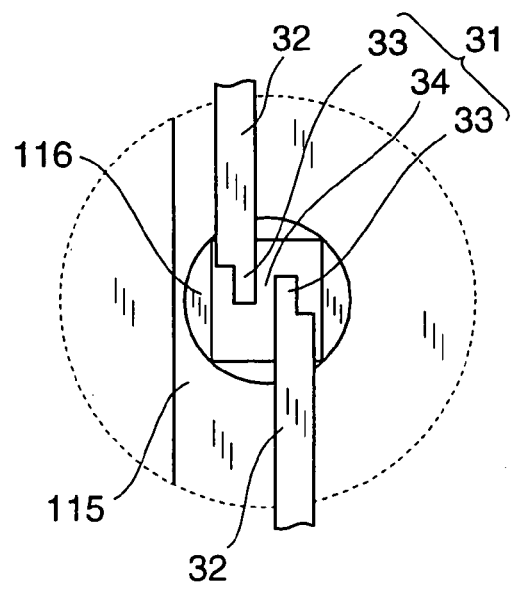
Figure 14B:
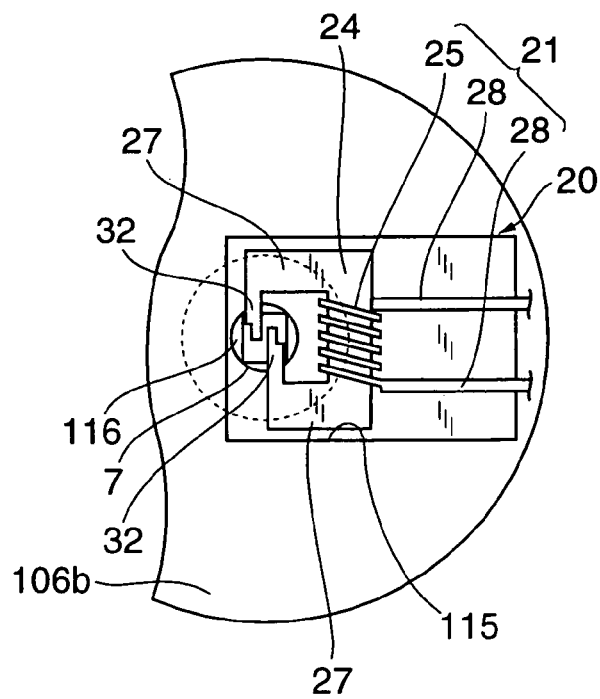

FIGS. 14A to 14C are, respectively, a section view seen from a side face, a bottom view, and an enlarged bottom view of the main portion of a magnetooptic head according to an eleventh embodiment of the invention. A magnetooptic head 100 has: a semiconductor laser 102 for emitting a laser beam 2a; a collimator lens 103 for shaping the laser beam 2a emitted from the semiconductor laser 102 into a parallel beam 2b; a mirror 104 for reflecting the parallel beam 2b from the collimator lens 103 in the vertical direction; a condense lens 105 for converging the parallel beam 2b reflected by the mirror 104; a transparent condensing medium 106 on which light 2c converged by the condensing lens 105 is incident and which forms a beam spot 107 on a light-receiving surface 106b; and the thin film magnetic transducer 20 having a magnetic gap smaller than the beam spot 107 on the surface of the beam spot position of the light-receiving surface 106b of the transparent condensing medium 106.

As the semiconductor laser 102, for example, an AlGaInP laser for emitting a red laser beam (650 nm) can be used. The invention however is not limited to the laser but an infrared or blue laser can also be used. In the embodiment, what is called an edge emitting semiconductor laser which uses a cleavage plane of the laser semiconductor as an optical resonator and oscillates in parallel with the active layer or what is called a vertical cavity surface emitting semiconductor laser which oscillates in the vertical direction of the active layer by a resonator formed in parallel with the active layer may be used. In the case of using an edge emitting semiconductor laser, due to a large beam divergence angle, the distance to the collimator lens 103 can be shortened, so that the size of the magnetooptic head 100 can be reduced. In the case of using a vertical cavity surface emitting semiconductor laser, since an output beam is circular, light can be condensed with little shading in the collimator lens 103. The light utilizing efficiency can be therefore raised.

As the transparent condensing medium 106, for example, a hemispherical solid immersion lens having a refractive index of about 2.0 made of dense flint glass is used. The numerical aperture of the condense lens 105 is 0.7, and the size of the beam spot 107 formed on the light-receiving surface 106b is about 0.25 μm. From the beam spot 107, the laser beam 107a in which a propagation component and a near field component are mixed goes out. The laser beam 107a rapidly diverges after going out from the light-receiving surface 106b. In order to set the dimension of the irradiation region to about the diameter of the beam spot 107, therefore, the recording medium has to be positioned close to the position of small fractions of a laser wavelength. As the transparent condensing medium 106, a super solid immersion lens having a truncated spherical shape can also be used.

The thin film magnetic transducer 20 includes: as shown in FIGS. 14B and 14C, a magnetic circuit 30 which has the core 24, the yoke 27 and the poles 32 made of a soft magnetic material such as Permalloy and has a magnetic gap 34 in the beam spot position; and a coil portion 21 having the coil 25, the lead wires 28, and pads (not shown). The gap portion 31 includes the magnetic gap 34 and the pair of pole tips 33. In the transparent condensing medium 106, the projection 116 is provided in the beam spot position of the light-receiving surface 106b and the recess 115 is formed around the projection 116. The gap portion 31 has the pole tips 33 and the magnetic gap 34 on the projection 116 as shown in FIG. 14C. The surfaces of the pole tips 33 and the light-receiving surface 106b are formed so as to be almost flush with each other. The magnetic gap 34 has a length of 0.1 μm and a width of 0.15 μm, and the size of the magnetic gap 34 can be further reduced as the process technologies advance. The magnetic circuit 30, the coil 25, and the lead wires 28 except for the pole tips 33 of the thin film magnetic transducer 20 are arranged in the recess 115.

Figure 15A:
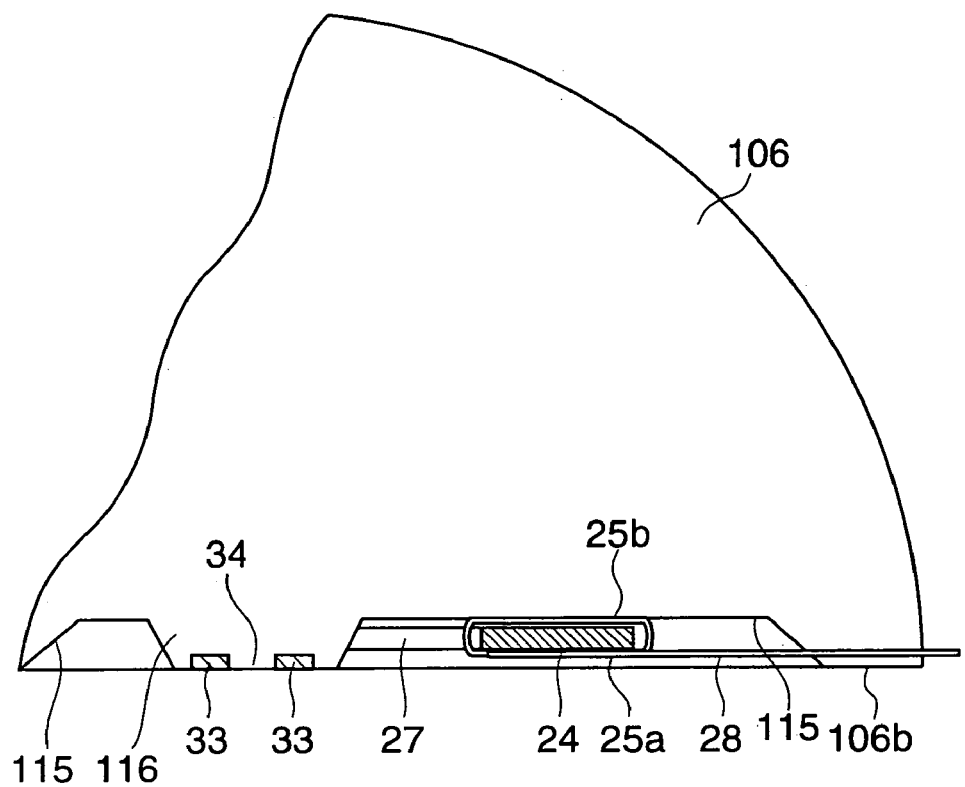
FIGS. 15A and 15B are, respectively, a section view seen from a side face and a section view seen from the front and show an example of a method of fabricating a thin film magnetic transducer according to the eleventh embodiment.
Figure 15B:
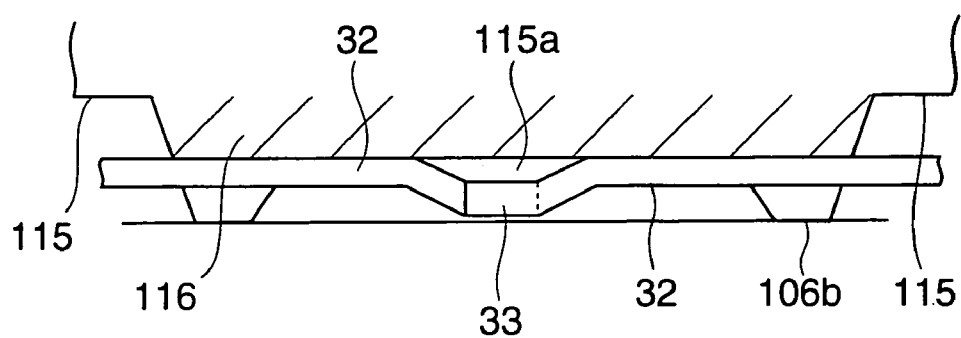

FIGS. 15A and 15B are, respectively, a section view seen from a side face and a section view seen from the front and show an example of a method of fabricating the thin film magnetic transducer 20. The projection 116 remains in the beam spot position of the light-receiving surface 106b of the transparent condensing medium 106, the recess 115a is formed in the center of the projection 116 and the recess 115 is formed around the projection 116 by dry etching. After that, layers which construct the thin film magnetic transducer 20 are formed by sputtering and photolithography. Specifically, the top coil 25b made by a Cu thin film is deposited by sputtering in a regular thin film process. After that, patterning is made and the top coil 25b is buried so as to be planarized by using an $SiO_2$ film. A soft magnetic film made of Permalloy or the like for the magnetic circuit 30 is formed by sputtering, similarly patterned and buried so as to be planarized. Further, the bottom coil 25a, the lead wires 28, the pads 29, and the poles 32 and the pole tips 33 of the magnetic circuit 30 are formed by repeating similar steps, thereby completing the thin film magnetic transducer 20. The pole 32 and its pole tip 33 are embedded in the light-receiving surface 106b so that the surfaces of the pole 32 and the pole tip 33 are flush with each other. In the embodiment as well, obviously, by using the magnetic gap and the shading body having the opening shown in FIGS. 3A to 3F and FIGS. 4A and 4B, the recording density can be increased.

The operation of the magnetooptic head 100 will now be described. At the time of recording, since the laser beam and the magnetic field can be applied to the magnetic recording medium 51a formed on the substrate 51b of the magnetic disk 51, what is called optically assisted magnetic recording is performed by heating the recording portion of the magnetic recording medium 51a by the application of the laser beam to thereby decrease the coercive force in the position, and recording information by a modulated magnetic field. The recording mark of the size determined by the size of the magnetic gap 34 between the pole tips 33 is formed. At the time of reproduction, by converting a change in the magnetic flux entering the pole tip 33 when the gap portion 31 passes through the magnetic field leaked from the magnetic recording medium 51a into a current by the coil 25, information recorded on the magnetic recording medium 51a is reproduced.

According to the eleventh embodiment, the thin film magnetic transducer 20 is stacked on the light-receiving surface 106b of the transparent condensing medium 106, so that the optically assisted magnetic recording can be carried out, the size and weight of the magnetooptic head can be reduced, and the higher transfer rate can be achieved. Since the magnetic recording medium having a high coercive force at room temperature can be used for recording, stable, long-life magnetic recording can be implemented. In the case of using a recording medium made of a ferrimagnetic material such as TbFeCo, the magnetization increases by the rise in temperature. In the embodiment, in a manner similar to the first embodiment, by emitting a laser beam at the time of reproduction, the sensitivity can be increased. In this case, the semiconductor laser may be either continuously turned on or intermittently turned on synchronously with the recording mark positions. In the former case, since synchronization is unnecessary, the circuit for turning on the laser can be simplified. In the latter case, the energy efficiency of the laser beam can be raised and the light emitting portion can be prevented from being heated. Obviously, when a recording medium having a relatively small coercive force is used, information can be recorded only by a magnetic field by using the head of the embodiment without applying a laser beam.

Figure 16:
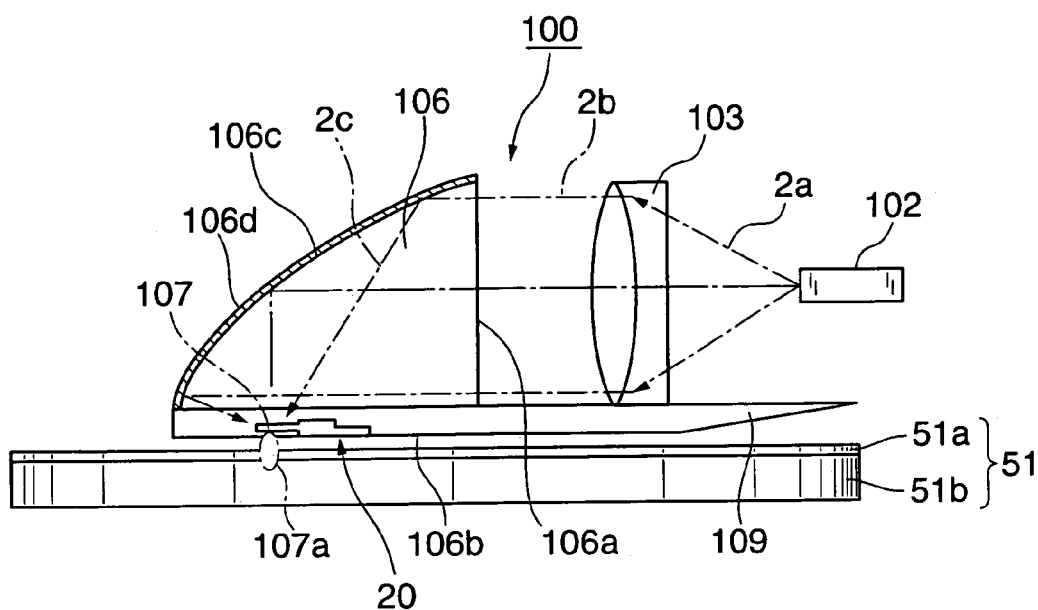
FIG. 16 is a diagram showing a magnetooptic head according to a twelfth embodiment of the invention.

FIG. 16 shows a magnetooptic head according to a twelfth embodiment of the invention. The magnetooptic head is constructed in a manner similar to the eleventh embodiment except that the transparent condensing medium is made by a transparent condensing medium 106 having a reflecting surface 106c and a flying slider 109 having a light-receiving surface 106b. The reflecting surface 106c is constructed by a part of a paraboloid of revolution. The transparent condensing medium 106 and the flying slider 109 are made of materials having almost the same refractive index, such as dense flint glass having a refractive index of about 2.0. The thin film magnetic transducer 20 is formed on the light-receiving surface 106b of the flying slider 109, and the magnetic gap 23 is formed in the beam spot position.

The operation of the optical head according to the twelfth embodiment will now be described. The laser beam 2a emitted from the semiconductor laser 102 is converted to the parallel light 2b by the collimator lens 103. The parallel light 2b is incident on the incident surface 106a of the transparent condensing medium 106 and is reflected by the reflecting surface 106c and the reflecting film 106d which is formed on the reflecting surface 106c. The reflection light is condensed on the light-receiving surface 106b of the flying slider 109 so as to form the beam spot 107. In a manner similar to the eleventh embodiment, optically assisted magnetic recording and optically assisted magnetic reproduction are performed on the magnetic recording medium 51a.

According to the twelfth embodiment, the numerical aperture of the reflection surface 106c can be set to 0.8 or larger which is larger than that of the transparent condensing medium 106 used in the fifteenth embodiment. Consequently, the size of the beam spot 107 can be made smaller than that in the fifteenth embodiment, and the optical efficiency can be raised. The shading body 19, any of various openings 13 and any of the magnetic tips 33 used in the second embodiment shown in FIGS. 3A to 3F can be formed on the light-receiving surface 106b. By the formation, effects similar to those of the second embodiment can be produced.

Figure 17:
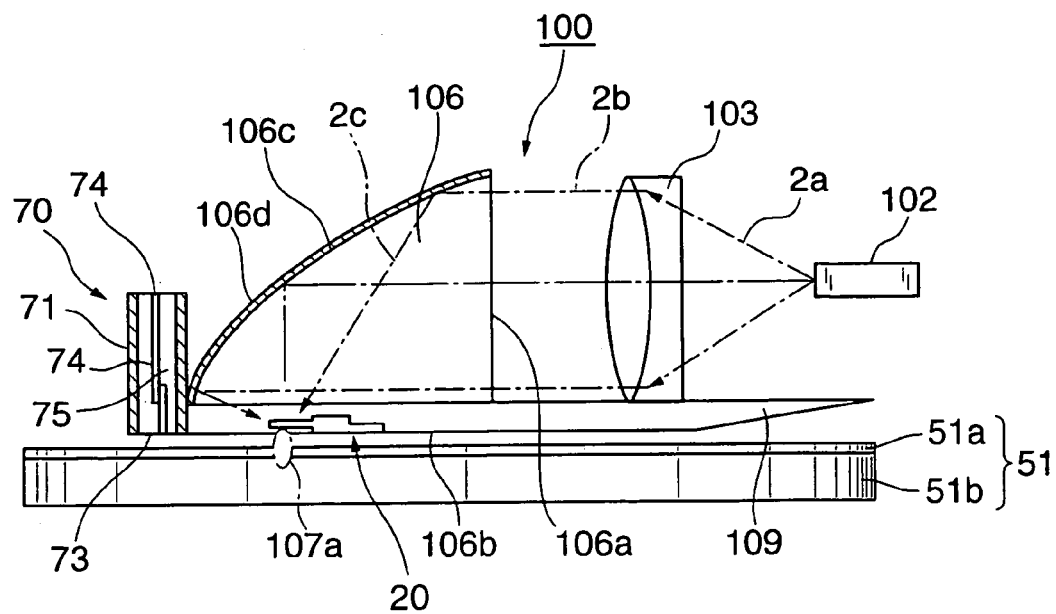
FIG. 17 is a diagram showing a magnetooptic head according to a thirteenth embodiment of the invention.

FIG. 17 shows a magnetooptic head according to a thirteenth embodiment of the invention. The magnetooptic head 100 is similar to that of the twelfth embodiment except that the magnetic sensor 70 which takes the form of a GMR (Giant Magneto Resistive sensor) is disposed on the downstream side of the magnetic gap 34. The magnetic sensor 70 includes a spin valve 73 and an electrode 72 as a magnetic sensing portion which is sandwiched by the magnetic shielding films 71 via the insulating films 74 and 75. The magnetic sensor 70 can sense a very small magnetic field with high sensitivity. A medium made of a material such as CoCrTa or GaFeCo having a magnetization which is large at the room temperature is therefore used. As the magnetooptic device 1, any of the magnetooptic devices in the foregoing embodiments can be used. Since a recording mark can be irradiated with a laser beam at the time of reproduction with GMR as well, it is also possible to use a ferrimagnetic medium made of TeFeCo or the like, whose magnetization is weak at the room temperature but is increased by an increase in the temperature, and to enhance the reproduction sensitivity by the increase in the temperature. Considering that the GMR sensor 70 is sensitive to heat, the semiconductor laser 2 is driven by a short-pulse laser beam at the time of recording and reproduction.

According to the thirteenth embodiment, high-sensitive magnetic field detection can be performed by the GMR sensor. Consequently, not only high recording density but also recording and reproduction at high transfer rate can be implemented.

Figure 18A:
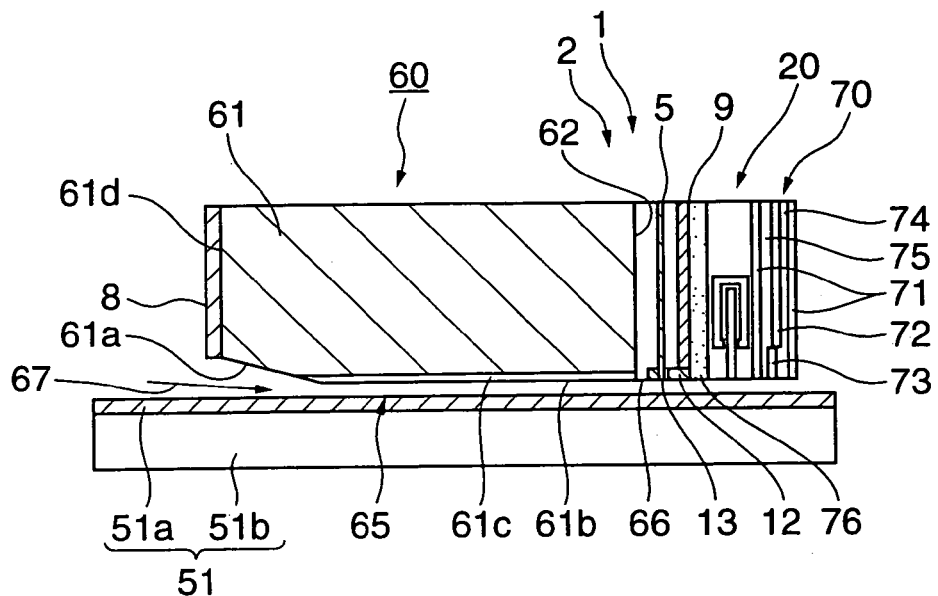
FIGS. 18A and 18B are, respectively, a section view of the main portion and a bottom view of a magnetooptic head according to a fourteenth embodiment of the invention.
Figure 18B:
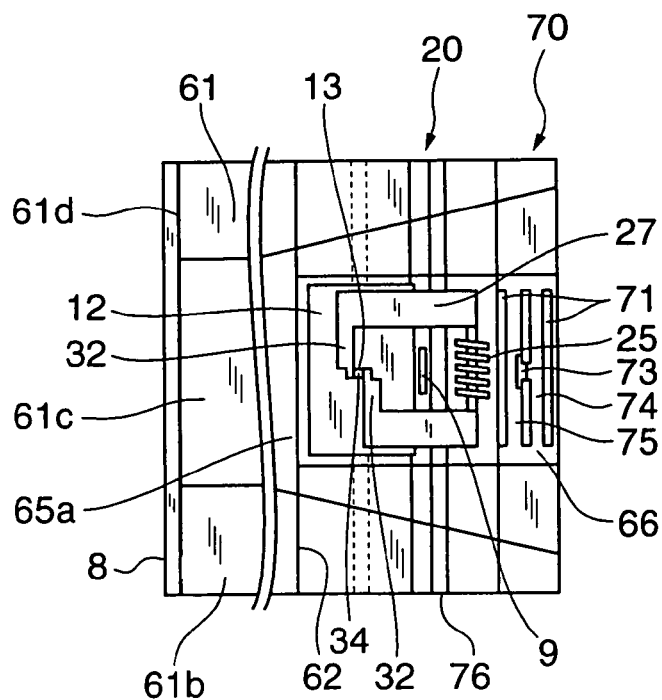

FIGS. 18A and 18B are, respectively, a section view and a bottom view of a main portion of a magnetooptic head according to a fourteenth embodiment of the invention. As shown in FIG. 18A, the magnetooptic head 60 of the fourteenth embodiment has the flying slider 61 made of a conductive GaN substrate. The n-type electrode 8 is formed at the end face 61d of the flying slider 61. The semiconductor laser 2 provided with the shading body 12 having the opening 13 is stacked on the rear end face 62 of the flying slider 61. The thin film magnetic transducer 20 similar to that in the second embodiment is stacked on the rear side of the semiconductor laser 2. Further, on the rear side of the thin film magnetic transducer 20, the magnetic sensor 70 similar to that shown in FIG. 13 is stacked. The slider face 65 is formed on the bottom face. The arrangement makes the magnetooptic head 60 travel over the magnetic recording medium 51a of the optical disk 51 in a state where the laser beam and the magnetic gap are close to each other. The optically assisted magnetic recording can be therefore performed onto a magnetic recording film or a magnetooptic recording film and signals can be reproduced by the magnetic sensor 70. In the embodiment, in order to prevent an influence of the heat generated with the semiconductor laser 2 from exerting onto the magnetic sensor 70, the magnetic sensor 70 is formed on the thin film magnetic transducer 20. The order of the elements of the conventional magnetic head is inverted here. The semiconductor laser 2, n-type electrode 8, thin film magnetic transducer 20, and magnetic sensor 70 construct the magnetooptic device.

The slider face 65 is constructed by the inclined tip face 61a, the bottom face of the flying slider 61, and the projection 61b and the recess 61c formed in the output face 66 of the semiconductor laser 2. The projection 61b and the recess 61c travel over an air stream 67 by the inclined face 61a and the positive and negative pressures are generated by the projection 61b and the recess 61c, thereby enabling the magnetooptic head 60 to fly and travel with a proper flying height.

Although the thin film magnetic transducer 20 similar to that in the second embodiment is used, the invention is not limited to the transducer. A thin film magnetic transducer similar to any of those in the other embodiments can also be used and by which similar effects can be obtained. The semiconductor laser 2 shown in any of the first to third embodiments and the like can be used and similar effects can be obtained.

Figure 19A:
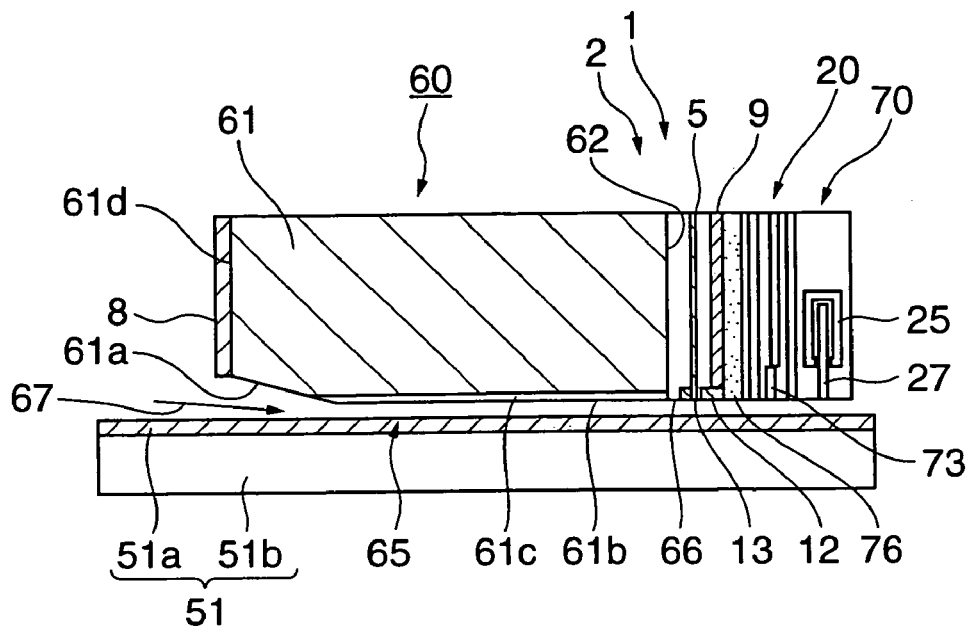
FIGS. 19A and 19B are, respectively, a section view of the main portion and a bottom view of a magnetooptic head according to a fifteenth embodiment of the invention.
Figure 19B:
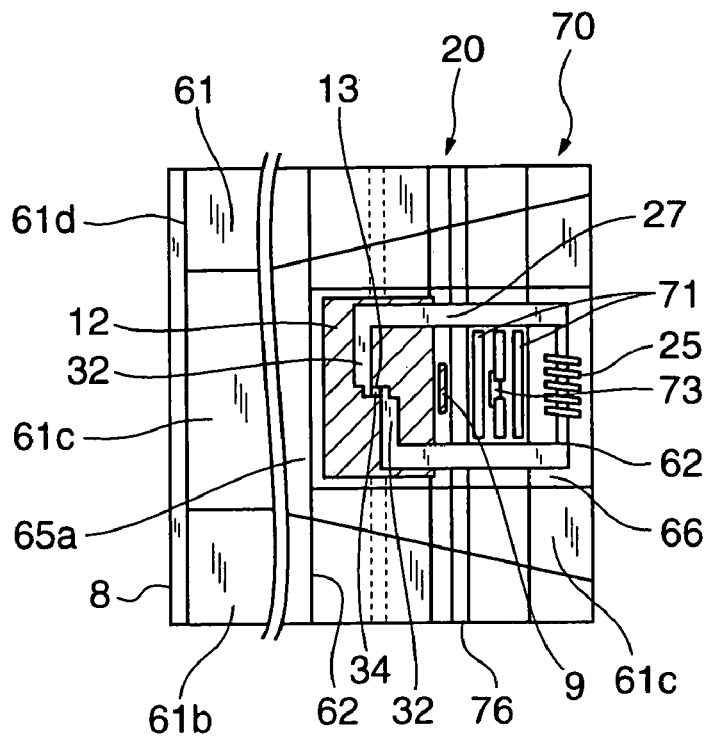
Figure 20:
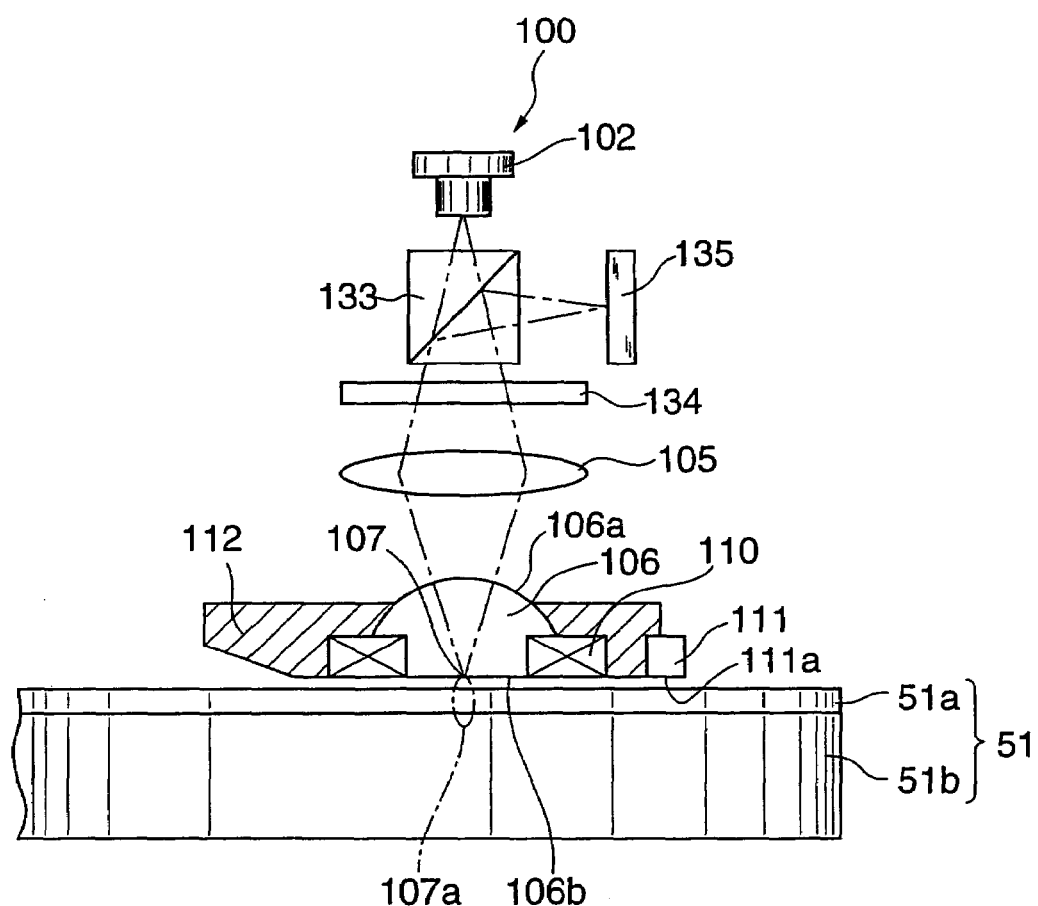
FIG. 20 is a view showing a conventional magnetooptic head.

FIGS. 19A and 19B are, respectively, a section view and a bottom view of the main portion of a magnetooptic head according to a fifteenth embodiment of the invention. In the magnetooptic head 60 of the fifteenth embodiment, as shown in FIG. 19A, the magnetic sensor 70 and the thin film magnetic transducer 20 are sequentially stacked via a heat insulating film 76 made of polyimide on the semiconductor laser 2. The magnetooptic head 60 is similar to that of the fourteenth embodiment except that the magnetic sensor 70 and the thin film magnetic transducer 20 are positioned opposite to each other. Since the order of forming the magnetic sensor 70 and the thin film magnetic transducer 20 is the same as that of a conventional magnetic head, a very reliable, established manufacturing process can be used as it is. Thus, a cheap, very reliable flying recording head can be provided.

Any of the magnetooptic heads in the eleventh to fifteenth embodiments can be applied to a magnetic disk drive shown in FIG. 11. A shading body having an opening can also be disposed below the gap portion 31 formed in the transparent condensing medium 106 or in the light-receiving surface 106b of the flying slider 109. As the gap portion 31 and the opening in this case, any of those shown in FIGS. 3A to 3F can be used. The positional relation shown in FIG. 4A or 4B may be used. As illustrated in FIGS. 10A, 10B and 10C, it is also possible to form plural magnetic gaps.

As described above, according to the invention, the magnetooptic thin film transducer is stacked on the semiconductor laser or the transparent condensing medium. Consequently, the optically assisted magnetic recording can be performed, the size and the weight of the device can be reduced, and the higher transfer rate can be achieved.

By providing the shading body having an opening and the magnetic gap in either the laser beam output surface of the semiconductor laser or the light-receiving surface of the transparent condensing medium, the size of the opening and that of the magnetic gap are reduced, thereby improving the recording density.

What is claimed is:

1. A magnetooptic device, comprising:
a semiconductor laser which emits a laser beam from a laser beam output surface;
a shading body having an opening in a laser beam output position in the laser beam output surface; and
a thin film magnetic transducer stacked on the semiconductor laser, the thin film magnetic transducer comprising a magnetic circuit having at least a pair of magnetic poles opposed to each other via a magnetic gap.

2. A magnetooptic device according to claim 1, wherein the magnetic gap is formed in the laser beam output position in the laser beam output surface.

3. A magnetooptic device according to claim 1, wherein:
the semiconductor laser is a vertical cavity surface emitting semiconductor laser, and
the shading body also serves as an electrode which is provided on the laser beam output surface side of the vertical cavity surface emitting semiconductor laser.

4. A magnetooptic device according to claim 1, wherein a length in a gap width direction of the opening is smaller than a gap width of the magnetic gap.

5. A magnetooptic device according to claim 1, wherein the opening is formed on the side of one of the pair of poles.

6. A magnetooptic device according to claim 1, wherein the shading body has a small metal body having a size smaller than that of the opening within the opening.

7. A magnetooptic device according to claim 1, wherein the shading body is formed around the pair of poles so that the shading body is flush with the pair of poles.

8. A magnetooptic device according to claim 1, wherein the shading body is provided adjacent to the pair of magnetic poles.

9. A magnetooptic device according to claim 1, wherein the shading body material blocks the laser beam.

10. A magnetooptic head, comprising:
a magnetooptic device having:
a semiconductor laser which emits a laser beam from a laser beam output surface,
a shading body having an opening in a laser beam output position in the laser beam output surface, and
a thin film magnetic transducer stacked on the semiconductor laser, the thin film magnetic transducer comprising a magnetic circuit having at least a pair of magnetic poles opposed to each other via a magnetic gap; and
a flying slider which holds the magnetooptic device and flies in a predetermined direction parallel with a surface of a recording medium over the recording medium.

11. A magnetooptic head according to claim 10, wherein:
the magnetic gap is formed in parallel with the predetermined direction; and
the opening has a rectangular shape which is long in the predetermined direction and is disposed nearer to the predetermined direction side than the magnetic gap.

12. A magnetooptic head according to claim 10, wherein:
the magnetic gap is formed perpendicular to the predetermined direction, and
the opening has a rectangular shape which is long along the predetermined direction and is disposed nearer to the predetermined direction side than the magnetic gap and is disposed nearer to one of the pair of poles.

13. A magnetooptic device according to claim 10, wherein the shading body is provided adjacent to the pair of magnetic poles.

14. A magnetooptic device according to claim 10, wherein the shading body material blocks the laser beam.

15. A magnetooptic head, comprising:
a magnetooptic device including a semiconductor laser which emits a laser beam from a laser beam output surface, a shading body having an opening in a laser beam output position in the laser beam output surface, a thin film magnetic transducer stacked on the semiconductor laser, and a magnetoresistive sensor, the thin film magnetic transducer comprising a magnetic circuit having at least a pair of magnetic poles opposed to each other via a magnetic gap; and
a flying slider which holds the magnetooptic device and flies over a recording medium in a predetermined direction relative to the recording medium.

16. A magnetooptic device according to claim 15, wherein the shading body is provided adjacent to the pair of magnetic poles.

17. A magnetooptic head according to claim 15, wherein the shading body material blocks the laser beam.

18. A magnetooptic device, comprising:

a semiconductor laser which emits a laser beam from a laser beam output surface;

a shading body having an opening in a laser beam output position in the laser beam output surface; and a thin film magnetic transducer stacked on the semiconductor laser, the thin film magnetic transducer comprising a magnetic circuit having at least a pair of magnetic poles opposed to each other via a magnetic gap, wherein the opening defines an area to which the laser beam is emitted such that a heated area is narrowed and heating of areas other than the heated area is reduced.

19. A magnetooptic head, comprising:

a magnetooptic device having:

a semiconductor laser which emits a laser beam from a laser beam output surface, a shading body having an opening in a laser beam output position in the laser beam output surface, and a thin film magnetic transducer stacked on the semiconductor laser, the thin film magnetic transducer comprising a magnetic circuit having at least a pair of magnetic poles opposed to each other via a magnetic gap; and a flying slider which holds the magnetooptic device and flies in a predetermined direction parallel with a surface of a recording medium over the recording medium, wherein the opening defines an area to which the laser beam is emitted such that a heated area is narrowed and heating of areas other than the heated area is reduced.

20. A magnetooptic head, comprising:

a magnetooptic device including a semiconductor laser which emits a laser beam from a laser beam output surface, a shading body having an opening in a laser beam output position in the laser beam output surface, a thin film magnetic transducer stacked on the semiconductor laser, and a magnetoresistive sensor, the thin film magnetic transducer comprising a magnetic circuit having at least a pair of magnetic poles opposed to each other via a magnetic gap; and a flying slider which holds the magnetooptic device and flies over a recording medium in a predetermined direction relative to the recording medium, wherein the opening defines an area to which the laser beam is emitted such that a heated area is narrowed and heating of areas other than the heated area is reduced.

* * * * *